US012635361B2

(12) United States Patent
Choi et al.

(10) Patent No.: US 12,635,361 B2
(45) Date of Patent: May 19, 2026

(54) DISPLAY DEVICE AND METHOD OF MANUFACTURING THE SAME

(71) Applicant: Samsung Display Co., LTD., Yongin-si (KR)

(72) Inventors: Jong Hyun Choi, Yongin-si (KR); Ju Hee Kim, Yongin-si (KR); Jin Hee Na, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 572 days.

(21) Appl. No.: 18/108,165

(22) Filed: Feb. 10, 2023

(65) Prior Publication Data

US 2023/0320133 A1    Oct. 5, 2023

(30) Foreign Application Priority Data

Mar. 21, 2022    (KR) ........................ 10-2022-0034501

(51) Int. Cl.
| | |
|---|---|
| *H10K 59/121* | (2023.01) |
| *H10K 59/12* | (2023.01) |
| *H10K 59/124* | (2023.01) |
| *H10K 59/131* | (2023.01) |
| *H10K 71/00* | (2023.01) |

(52) U.S. Cl.
CPC ....... *H10K 59/124* (2023.02); *H10K 59/1201* (2023.02); *H10K 59/131* (2023.02); *H10K 71/00* (2023.02); *H10K 59/1213* (2023.02)

(58) Field of Classification Search
CPC . H10K 59/1213; H10K 59/124; H10K 59/131
See application file for complete search history.

(56) References Cited

U.S. PATENT DOCUMENTS

| | | | |
|---|---|---|---|
| 10,347,176 B2 | 7/2019 | Lee et al. | |
| 10,868,096 B2 * | 12/2020 | Park ................... | H10K 59/1213 |
| 2005/0258443 A1 * | 11/2005 | Yamazaki ............ | H10K 59/875 |
| | | | 257/E27.12 |
| 2012/0074388 A1 * | 3/2012 | Park ................... | H10K 59/1216 |
| | | | 438/23 |

(Continued)

FOREIGN PATENT DOCUMENTS

| | | |
|---|---|---|
| CN | 107564941 | 1/2018 |
| KR | 10-2019-0104091 A | 9/2019 |

OTHER PUBLICATIONS

Korean Intellectual Property Office, Request for the Submission of an Opinion, Application No. 10-2022-0034501, Nov. 17, 2025, all pages. (Year: 2025).*

*Primary Examiner* — Victoria K. Hall
(74) *Attorney, Agent, or Firm* — Innovation Counsel LLP

(57)    ABSTRACT

A display device and a method of the manufacturing the display device is provided. The display device includes a substrate, a plurality of island pattern areas, a valley area partitioning the plurality of island pattern areas, a light emitting element emitting light, and a pixel driving part including a first subpixel driving part and a second subpixel driving part and supplying a driving current to the light emitting element. The plurality of island pattern areas include a first island pattern area in which the first subpixel driving part is disposed, and a second island pattern area in which the second subpixel driving part is disposed.

18 Claims, 30 Drawing Sheets

(56) References Cited

U.S. PATENT DOCUMENTS

| | | | |
|---|---|---|---|
| 2015/0287747 A1* | 10/2015 | Cheng | G02F 1/133345 |
| | | | 438/28 |
| 2016/0233280 A1* | 8/2016 | Cheng | H10K 59/124 |
| 2017/0069701 A1* | 3/2017 | Cai | H10K 59/1213 |
| 2018/0308916 A1* | 10/2018 | Kim | H10K 59/1216 |
| 2019/0267440 A1* | 8/2019 | Park | G09G 3/3233 |
| 2021/0280829 A1* | 9/2021 | Choi | H10K 59/8731 |
| 2022/0045137 A1* | 2/2022 | Bae | H10K 59/353 |
| 2022/0208899 A1* | 6/2022 | Yoon | H10K 59/124 |
| 2022/0415987 A1* | 12/2022 | Choi | H10K 59/124 |
| 2023/0209935 A1* | 6/2023 | Jang | H10K 50/841 |
| | | | 257/40 |
| 2024/0121997 A1* | 4/2024 | Ding | H10K 59/1201 |

* cited by examiner

PDU: PDU1, PDU2
200: GW, CE1, EM, DTG
300: CE2, GI1, GC1, VIL1
500: GI2, GC2
600: BE1, BE2, BE3, BE4, BE5, BE6, VIL2

PDU: PDU1, PDU2
SDU: SDU1a, SDU1b, SDU2a, SDU2b, SDU3a, SDU3b
200: GW, CE1, EM, DTG
300: CE2, GI1, GC1, VIL1
500: GI2, GC2
600: BE1, BE2, BE3, BE4, BE5, BE6, VIL2

700: DL, VDDL, ANDE

100: A1, DTA
200: GW, CE1, DTG
300: CE2, GC1
500: GC2
600: BE1, BE2, BE3, BE6
700: DL, VDDL, ANDE
VAL: VALa, VALb

100: A5, A6
200: GW, EM
300: GI1
400: A4
500: GI2
600: BE5, BE6
700: ANDE
VAL: VALc, VALd

100: A1, DTA
200: GW, CE1, DTG
300: CE2, GC1
500: GC2
600: BE1, BE2, BE3, BE6
700: DL, VDDL, ANDE
VAL: VALa, VALb

1_2

100: A5, A6
200: GW, EM
300: GI1
400: A4
500: GI2
600: BE5, BE6, VIL2
700: ANDE
VAL: VALc, VALd

100: A1, DTA
200: GW, CE1, DTG
300: CE2, GC1
500: GC2
600: BE1, BE2, BE3, BE6

100: A1, DTA
200: GW, CE1, DTG
300: CE2, GC1
500: GC2
600: BE1, BE2, BE3, BE6

100: A1, DTA
200: GW, CE1, DTG
300: CE2, GC1
500: GC2
600: BE1, BE2, BE3, BE6

100: A1, DTA
200: GW, CE1, DTG
300: CE2, GC1
500: GC2
600: BE1, BE2, BE3, BE6
700: DL, VDDL, ANDE
VAL: VALa, VALb

100: A1, DTA
200: GW, CE1, DTG
300: CE2, GC1
500: GC2
600: BE1, BE2, BE3, BE6
700: DL, VDDL, ANDE
VAL: VALa, VALb

PDU: PDU1, PDU2
SDU: SUD1a, SDU1b, SDU2a, SDU2b, SDU3a, SDU3b, SDU4a, SUD4b
200: GW, CE1, EM, DTG
300: CE2, GI1, GC1, VIL1
500: GI2, GC2
600: BE1, BE2, BE3, BE4, BE5, BE6, VIL2

PDU: PDU1, PDU2
200: GW, CE1, EM, DTG
300: CE2, GI1_1, GC1_1, VIL1
500: GI2_1, GC2_1
GI2_1: GI2a
GC2_1: GC2a

PDU: PDU1, PDU2
200: GW, CE1, EM, DTG
300: CE2, GI1_1, GC1_1, VIL1
500: GI2_1, GC2_1
600: BE1, BE2, BE3, BE4, BE5, BE6, BE7, BE8, VIL2

100: A1, DTA
200: GW, CE1, DTG
300: CE2, GC1_1
600: BE1, BE2, BE3, BE6
700: DL, VDDL, ANDE
VAL: VALa, VALb

1_5

TFE

873

EML

880

862

TFTL

861

CNT14    CNT15    BE8

850
840
830
820
810
BF

SUB

GC1_1    GC2_1

Z

300: GC1_1
500: GC2_1
600: BE8

E                    E'

PDU: PDU1, PDU2, PDU3, PDU4
200: GW, CE1, EM, DTG
300: CE2, GI1, GC1, VIL1
500: GI2, GC2
600: BE1, BE2, BE3, BE4, BE5, BE6, VIL2
700: VIE
VIL2: VIL2_1, VIL2_2

FIG. 30

PDU: PDU1, PDU2, PDU3, PDU4
ISL1: ISL1_1, ISL1_2
ISL2a: ISL2a_1, ISL2a_2
ISL2b: ISL2b_1, ISL2b_2
ISL3: ISL3_1, ISL3_2
700: VIE

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0034501 under 35 U.S.C. § 119, filed on Mar. 21, 2022, in the Korean Intellectual Property Office (KIPO), the contents of which are incorporated by reference herein in its entirety.

BACKGROUND

1. Technical Field

The disclosure relates to a display device and a method of manufacturing the same.

2. Description of the Related Art

With the advancement of the information technology, a demand for a display device for displaying an image has increased with various forms. For example, the display device has been applied to various electronic devices such as a smart phone, a digital camera, a laptop computer, a navigator and a smart television.

The display device includes a light receiving display device such as a liquid crystal display device and a field emission display device, and a light emitting display device such as an organic light emitting display device including an organic light emitting element, an inorganic light emitting display device including an inorganic light emitting element such as an inorganic semiconductor and a micro light emitting device including a micro light emitting element.

The organic light emitting display device includes a light emitting element in which each of pixels of a display panel may self-emit light, thereby displaying an image even without a backlight unit that provides light to the display panel.

SUMMARY

An object of the disclosure is to provide a display device and a method of manufacturing the same, in which transfer of external impact is suppressed or avoided to improve reliability.

The objects of the disclosure are not limited to those mentioned above, and additional objects of the disclosure, which are not mentioned herein, will be clearly understood by those skilled in the art from the following description of the disclosure.

An embodiment of a display device may include a substrate, a plurality of island pattern areas, a valley area partitioning the plurality of island pattern areas, a light emitting element emitting light; and a pixel driving part comprising a first subpixel driving part and a second subpixel driving part and supplying a driving current to the light emitting element. The plurality of island pattern areas may include a first island pattern area in which the first subpixel driving part is disposed, and a second island pattern area in which the second subpixel driving part is disposed.

An area of the first island pattern area may be different from an area of the second island pattern area.

The pixel driving part may include a plurality of transistors, the first subpixel driving part may include at least part of the plurality of transistors, and the second subpixel driving part may include at least another part of the plurality of transistors.

A number of the at least part of the plurality of transistors may be different from a number of the at least another part of the plurality of transistors.

The light emitting element may overlap the first island pattern area and the second island pattern area in a thickness direction of the substrate.

The display device may further include a scan line applying a scan signal to the pixel driving part. A channel area of one of the at least part of the plurality of transistors, which overlaps the scan line in a thickness direction of the substrate, may be disposed in the first island pattern area.

The first island pattern area may have a planar polygonal shape in a plan view. An outer angle defined by any two adjacent sides of the planar polygonal shape may be greater than or equal to about 90°.

The first island pattern area may have a planar polygonal shape in a plan view. An inner angle defined by any two adjacent sides of the planar polygonal shape may be greater than or equal to about 90°.

The first island pattern area may include a planar curved portion in a plan view.

An embodiment of a display device may include a substrate; a first island pattern area; a valley area disposed adjacent to the first island pattern area; and a plurality of subpixels, each comprising a light emitting element emitting light. The plurality of subpixels may further include a first pixel driving part driving a first subpixel and a second pixel driving part driving a second subpixel. The first island pattern area may overlap the first pixel driving part and the second pixel driving part in a thickness direction of the substrate.

The display device may further include a second island pattern area having an area different from an area of the first island pattern area. One of the first pixel driving part and the second pixel driving part may be disposed in the second island pattern area, and the valley area may partition the first island pattern area and the second island pattern area.

The plurality of subpixels may further include a third pixel driving part driving a third subpixel, and a fourth pixel driving part driving a fourth subpixel. The display device may further include a first sub-initialization voltage line disposed on the first pixel driving part and the second pixel driving part in a first direction, a second sub-initialization voltage line disposed on the third pixel driving part and the fourth pixel driving part in the first direction, and an initialization connection electrode. The first sub-initialization voltage line and the second sub-initialization voltage line may be spaced apart from each other, and the first sub-initialization voltage line and the second sub-initialization voltage line may be electrically connected to the initialization connection electrode through a first contact hole and a second contact hole, respectively.

The display device may further include a first scan initialization line, a second scan initialization line, and a scan connection electrode. The first scan initialization line and the second scan initialization line may be disposed on the first pixel driving part and the second pixel driving part, extend in a first direction, and overlap with each other. The second scan initialization line may include a disconnection portion of which end is disposed in the first pixel driving part and the second pixel driving part. The first scan initialization line and the second scan initialization line may be electrically connected to the scan connection electrode through a first contact hole and a second contact hole, respectively.

An embodiment of a display device may include a plurality of island pattern areas, a valley area partitioning the plurality of island pattern areas, and a thin film transistor layer disposed on a substrate. The thin film transistor layer may include a first semiconductor layer, a first insulating layer disposed on the first semiconductor layer, a first conductive layer disposed on the first insulating layer, a second insulating layer disposed on the first conductive layer, and a first data conductive layer disposed on the second insulating layer. An upper surface of the first conductive layer offset from the first data conductive layer in a thickness direction of the substrate may be exposed in the valley. The first data conductive layer may be disposed in each of the plurality of island pattern areas.

The thin film transistor layer may further include a first passivation layer disposed on the first data conductive layer. The first conductive layer and the first insulating layer disposed in the valley area may be covered by the first passivation layer.

The first conductive layer and the first insulating layer may be directly in contact with the first passivation layer in the valley area. The first passivation layer may include an organic material.

The second insulating layer may not overlap the valley area in the thickness direction of the substrate.

In each of the plurality of island pattern areas, the thin film transistor layer may further include a second semiconductor layer, a third insulating layer disposed on the second semiconductor layer, a second conductive layer disposed on the third insulating layer, and a fourth insulating layer disposed on the second conductive layer. The first semiconductor layer may be disposed on the fourth insulating layer.

The first semiconductor layer may include an oxide semiconductor, and the second semiconductor layer may include silicon.

The second semiconductor layer, the third insulating layer, the second conductive layer, the fourth insulating layer, the first insulating layer, and the first conductive layer may be sequentially disposed in the valley area.

In each of the plurality of island pattern areas, the thin film transistor layer may further include a second conductive layer disposed on the first insulating layer, a third insulating layer disposed on the second conductive layer, and a third conductive layer disposed on the third insulating layer. The second conductive layer and the third insulating layer may be disposed between the first insulating layer and the third conductive layer.

The first semiconductor layer, the first insulating layer, the second conductive layer, the third insulating layer, and the third conductive layer may be sequentially disposed in the valley area.

An embodiment of a method of manufacturing a display device may include forming a semiconductor layer in a substrate; forming a first insulating layer on the semiconductor layer; forming a first conductive layer on the first insulating layer; forming a second insulating layer on the first conductive layer; forming a first data conductive layer on the second insulating layer; forming a photo-resist pattern in an area overlapping the first data conductive layer in a thickness direction of the substrate; and exposing the first conductive layer by etching the second insulating layer using the photo-resist pattern as an etching mask.

The exposing of the first conductive layer may include etching the second insulating layer using the first data conductive layer as an etching mask to expose the first conductive layer.

In the display device and the method of manufacturing the same according to the embodiments of the disclosure, the display device may include a valley area that suppresses or avoids transfer of external impact by an insulating layer, and a plurality of island pattern area partitioned by the valley. Therefore, transfer of external impact may be suppressed or avoided, whereby reliability of the display device may be improved.

The effects according to the embodiments of the disclosure are not limited to those mentioned above, and more various effects are included in the following description of the disclosure.

BRIEF DESCRIPTION OF THE DRAWINGS

The above and other aspects and features of the disclosure will become more apparent by describing in detail embodiments thereof with reference to the attached drawings, in which:

FIG. 30 is a layout view illustrating multiple island patterns and a valley in FIG. 29.

DETAILED DESCRIPTION OF THE EMBODIMENTS

Figure 1:
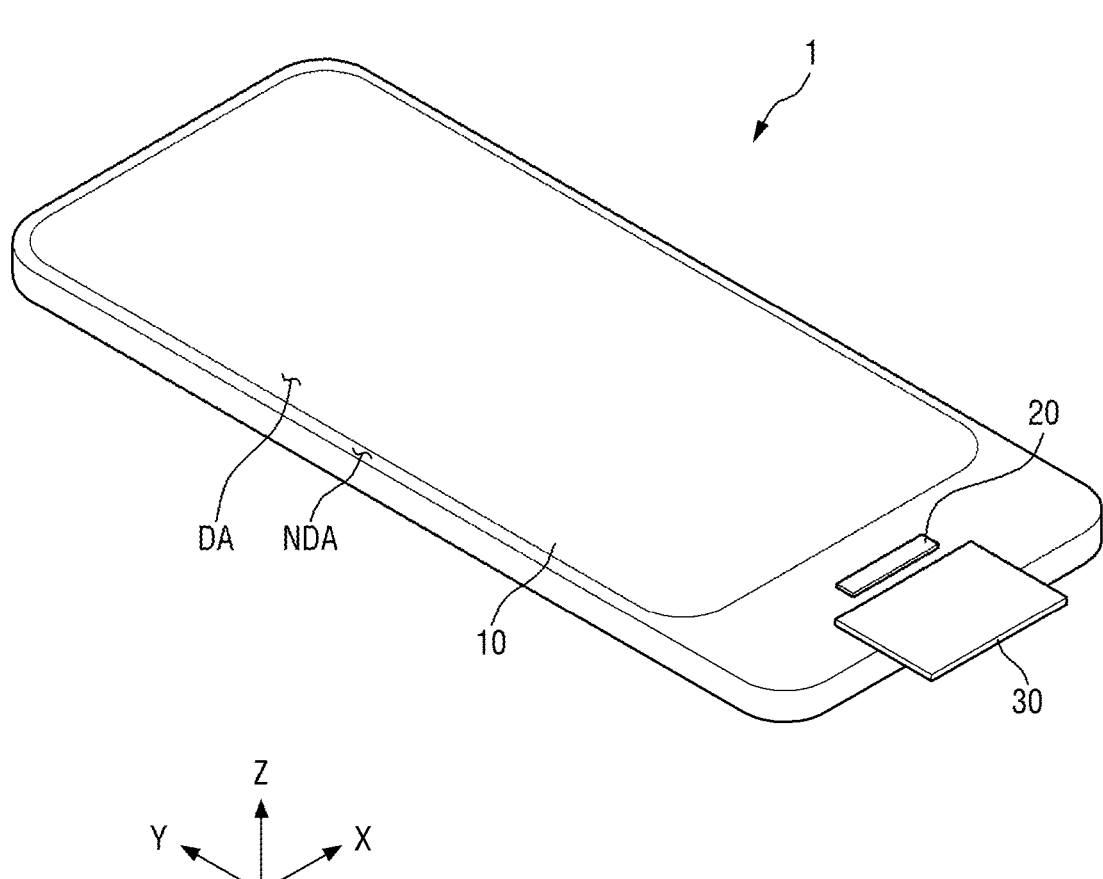
FIG. 1 is a perspective view illustrating a display device according to one embodiment of the disclosure.

The disclosure will now be described more fully hereinafter with reference to the accompanying drawings, in which embodiments of the disclosure are shown. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

The X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element's as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below", for example, can encompass both an orientation of above and below. Furthermore, the apparatus may be otherwise oriented (e.g., rotated 90 degrees or at other orientations), and, as such, the spatially relative descriptors used herein interpreted accordingly.

The terms "above," "top" and "top surface" as used herein refer to an upward direction (i.e., a Z-axis direction) with respect to the display device. The terms "below," "bottom" and "bottom surface" as used herein refer to a downward direction (i.e., a direction opposite to the Z-axis direction) with respect to the display device. Further, the terms "left," "right," "upper," and "lower" respectively indicate corresponding directions on the surface of the display device. For example, the term "left" indicates a direction opposite to an X-axis direction, the term "right" indicates the X-axis direction, the term "upper" indicates a Y-axis direction, and the term "lower" indicates a direction opposite to the Y-axis direction. Further, in the accompanying drawings, the size and relative sizes of elements may be exaggerated for clarity and/or descriptive purposes.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YA, and ZZ. As used herein, the term "and/or" includes any and all combinations of one or more of the associated listed items.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, detailed embodiments of the disclosure will be described with reference to the accompanying drawings.

Figure 2:
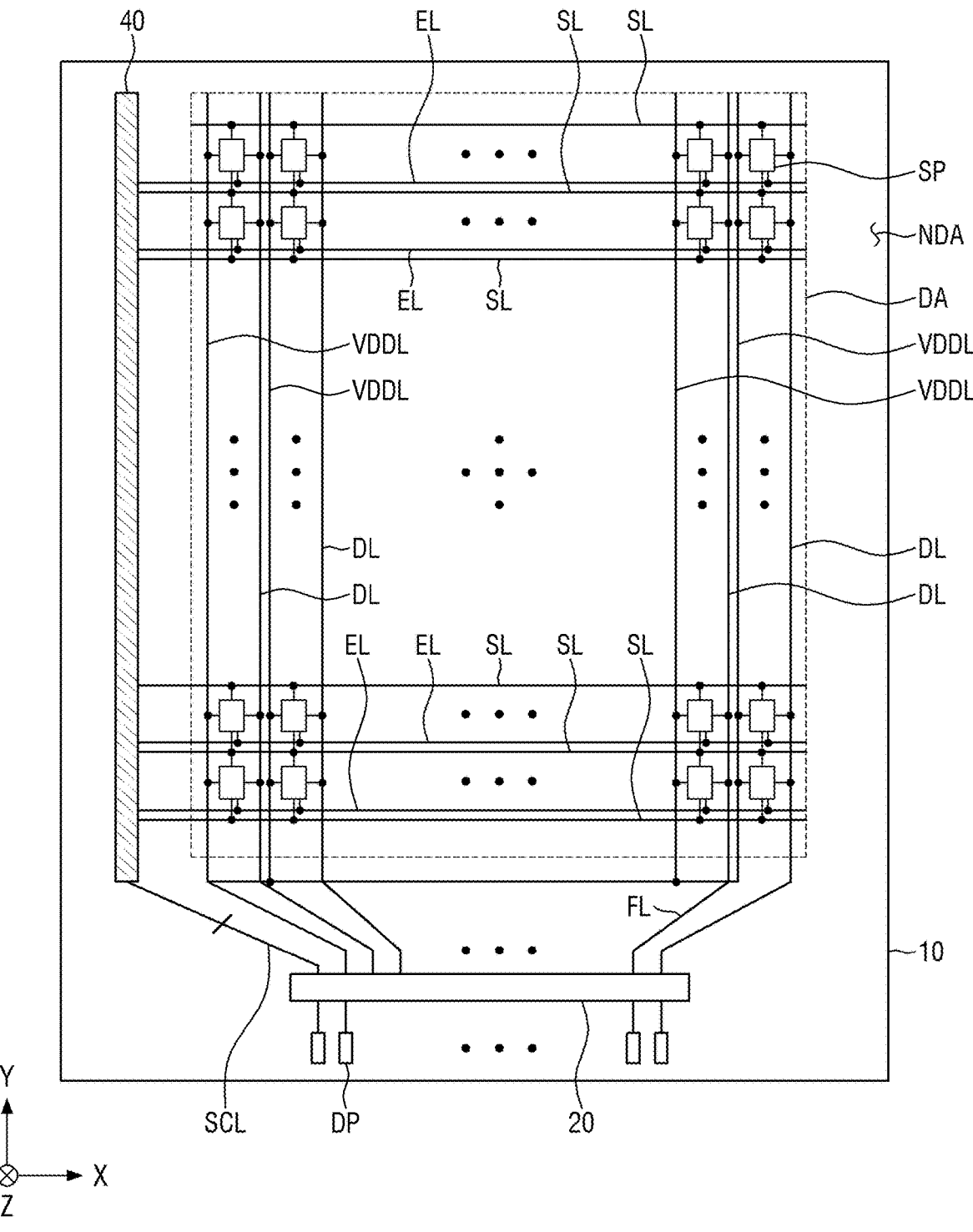
FIG. 2 is a plan view illustrating a display device according to one embodiment of the disclosure.

FIG. 1 is a perspective view illustrating a display device according to one embodiment of the disclosure. FIG. 2 is a plan view illustrating a display device according to one embodiment of the disclosure.

Referring to FIGS. 1 and 2, the display device 1 is a device that displays a moving image or a still image. The display device 1 may be used as a display screen of various products such as a television, a laptop computer, a monitor, a billboard, and a device for Internet of things (IoT) as well as portable electronic devices such as a mobile phone, a smart phone, a tablet personal computer (PC), a smart watch, a watch phone, a mobile communication terminal, an electronic diary, an electronic book, a navigator, and an ultra mobile PC (UMPC).

The display device 1 may be a light emitting display device such as an organic light emitting display device using an organic light emitting diode, a quantum dot light emitting display device including a quantum dot light emitting layer, an inorganic light emitting display device including an inorganic semiconductor, and a micro light emitting display device using a micro light emitting diode (LED). Although the display device 1 is described as an organic light emitting display device in FIG. 1, the disclosure is not limited thereto.

The display device 1 may include a display panel 10, a display driving circuit 20, and a circuit board 30.

The display panel 10 may be formed as a rectangular shape with a short side in a first direction X and a long side in a second direction Y crossing the first direction X. A corner where a short side in the first direction X and a long side in the second direction Y meet may be formed to be rounded to have a predetermined (or selectable) curvature or may be formed at right angles. The planar shape of the display panel 10 is not limited to a rectangle, and may be formed in other polygonal, circular, or elliptical shapes. The display panel 10 may be formed to be flat, but is not limited thereto, and may include a curved portion formed at left and right ends, having a constant curvature or variable curvature. The display panel 10 may be flexible that may be curved, twisted, bent, folded, or rolled.

The display panel 10 may include a display area DA in which subpixels SP are formed to display an image, and a non-display area NDA that is a peripheral area of the display panel 10. In addition to the subpixels SP, scan lines SL, emission control lines EL, data lines DL and a first driving voltage lines VDDL, which are connected to the subpixels SP, may be disposed in the display area DA. The scan lines SL and the emission control lines EL may be formed in parallel in the first direction X, and the data lines DL may be formed in parallel in the second direction Y crossing the first direction X. A first driving voltage line VDDL may be formed in parallel in the second direction Y in the display area DA. The first driving voltage line VDDL formed in parallel in the second direction Y in the display area DA may be connected to another first driving voltage line in the non-display area NDA.

Each of the subpixels SP may be connected to at least one of the scan lines SL, at least one of the data lines DL, at least one of the emission control lines EL and the first driving voltage line VDDL. In FIG. 2, each of the subpixels SP is illustrated as being connected to two scan lines SL, one data line DL, one emission control line EL and the first driving voltage line VDDL, but is not limited thereto. For example, each of the subpixels SP may be connected to four scan lines SL rather than two scan lines SL.

Each of the subpixels SP may include a driving transistor, at least one transistor, a light emitting element, and a capacitor. The transistor may be turned on in case that a scan signal is applied from the scan line SL, whereby a voltage of the data line DL may be applied to a gate electrode of the driving transistor. The driving transistor may emit light by supplying a driving current to the light emitting element in accordance with the data voltage applied to the gate electrode. The driving transistor and the at least one transistor may be thin film transistors. The light emitting element may emit light in accordance with the driving current of the driving transistor. The light emitting element may be an organic light emitting diode that includes a first electrode, an organic light emitting layer, and a second electrode. The capacitor may serve to uniformly maintain the data voltage applied to the gate electrode of the driving transistor.

The non-display area NDA may be defined as an area from the outside of the display area DA to an edge of the display panel 10. The non-display area NDA may include a scan driving circuit 40 for applying scan signals to the scan lines SL, fan-out lines FL between the data lines DL and the display driving circuit 20, and pads DP connected to the display driving circuit 20. The display driving circuit 20 and the pads DP may be disposed at an edge of one side of the display panel 10. The pads DP may be disposed to be more adjacent to the edge of one side of the display panel 10 than the display driving circuit 20.

Figure 3:
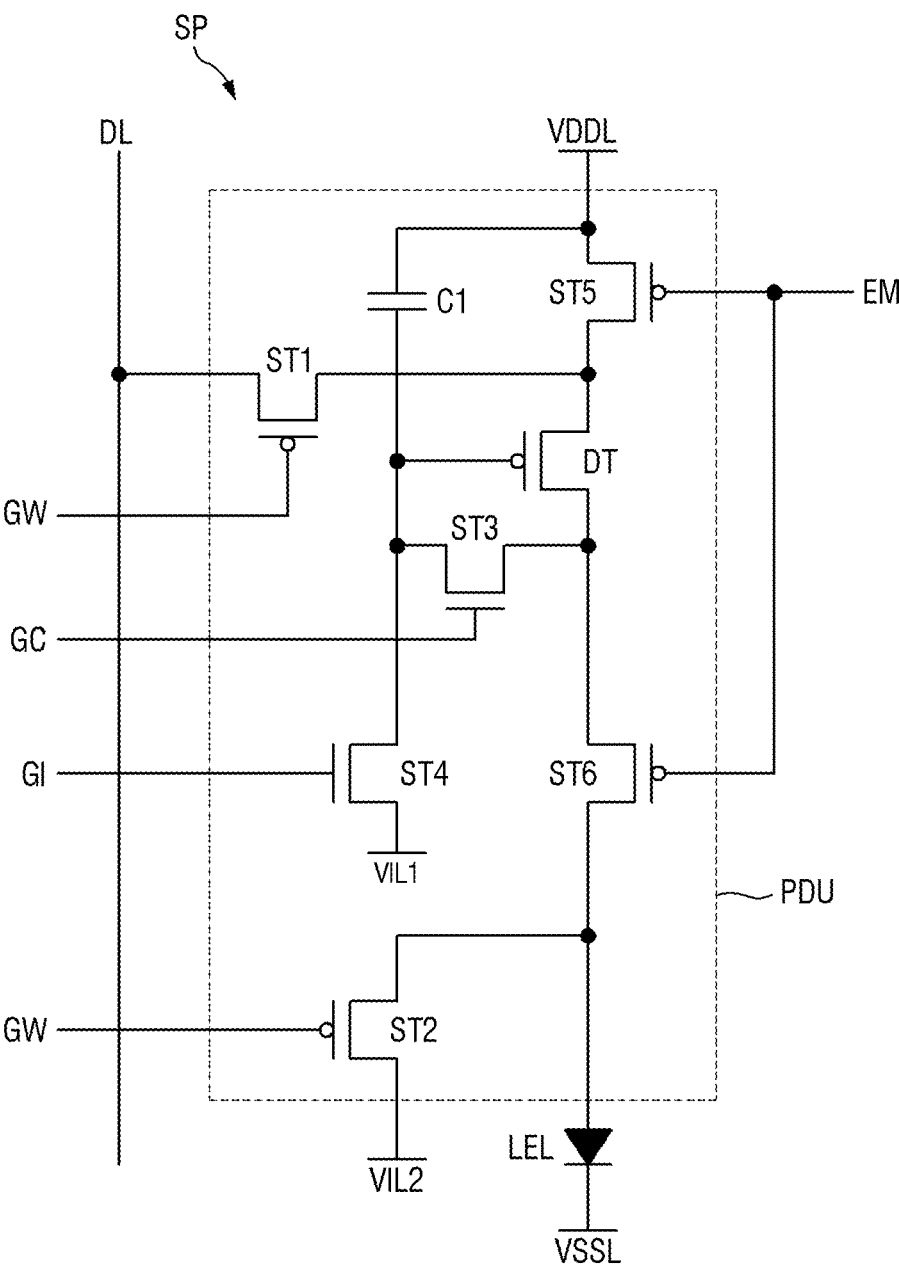
FIG. 3 is a schematic diagram of an equivalent circuit of a subpixel according to one embodiment of the disclosure.

The scan driving circuit 40 may be connected to the display driving circuit 20 through multiple scan control lines SCL. The scan driving circuit 40 may receive a scan control signal and an emission control signal from the display driving circuit 20 through the scan control lines SCL. The scan driving circuit 40 may include a scan driver and a light emitting control driver. As shown in FIG. 3, the scan lines SL may include a scan initialization line GI, a scan control line GC, and a scan write line GW.

The display driving circuit 20 may be formed of an integrated circuit (IC) and may be attached onto the display panel 10 by a chip on glass (COG) method, a chip on plastic (COP) method, or an ultrasonic bonding method, but is not limited thereto. For example, the display driving circuit 20 may be attached onto the circuit board 30.

The circuit board 30 may be attached onto the pads DP using an anisotropic conductive film. As a result, lead lines of the circuit board 30 may be electrically connected to the pads DP. The circuit board 30 may be a flexible printed circuit board, a printed circuit board, or a flexible film such as a chip on film.

FIG. 3 is a schematic diagram of an equivalent circuit of a subpixel according to one embodiment of the disclosure.

Referring to FIG. 3, the subpixel SP may include a light emitting element LEL and a pixel driving part PDU for controlling the emission amount of the light emitting element LEL. The pixel driving part PDU may include a driving transistor DT, multiple switch elements, and a first capacitor C1. The switch elements may include first to sixth transistors ST1, ST2, ST3, ST4, ST5 and ST6.

The subpixel SP may be connected to the scan initialization line GI, the scan control line GC, the scan write line GW and the data line DL. The subpixel SP may be connected to the first driving voltage line VDDL to which a first driving voltage is supplied, a first initialization voltage line VIL1 to which a first initialization voltage is supplied, a second initialization voltage line VIL2 to which a second initialization voltage is supplied, and a second driving voltage line VSSL to which a second driving voltage is supplied. The subpixel SP may be connected to an emission control line EM to which an emission control signal is supplied.

The driving transistor DT may include a gate electrode, a first electrode, and a second electrode. The driving transistor DT may control a drain-source current Isd (hereinafter, referred to as a "driving current") flowing between the first electrode and the second electrode in accordance with the data voltage applied to the gate electrode. The driving current Isd flowing through a channel of the driving transistor DT may be proportional to square of a difference between a voltage Vgs between the first electrode and the gate electrode of the driving transistor DT and a threshold voltage Vth, as expressed by the following Equation 1.

$$Isd = k' \times (Vsg - Vth)^2 \qquad \text{[Equation 1]}$$

In the Equation 1, Isd denotes a driving current, a source-drain current flowing through the channel of the driving transistor DT, k' denotes a proportional coefficient determined by a structure and physical characteristics of the driving transistor, and Vsg denotes a voltage between the first electrode and the gate electrode of the driving transistor, and Vth denotes a threshold voltage of the driving transistor.

Figure 11:
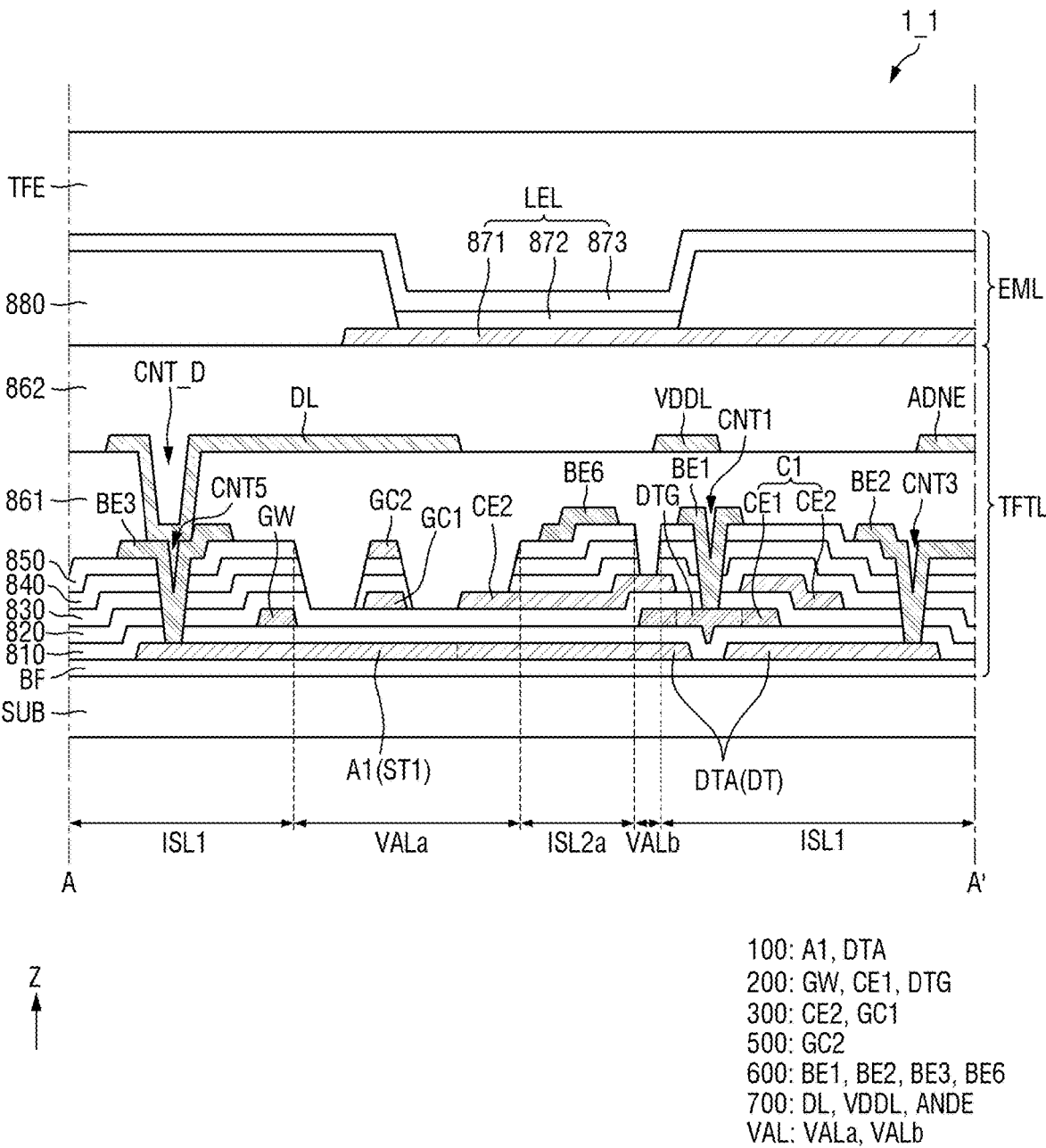
FIG. 11 is a schematic cross-sectional view taken along line A-A' of FIGS. 5, 6 and 10 according to an embodiment of the disclosure.

The light emitting element LEL may emit light in accordance with the driving current Isd. As the driving current Isd is increased, the emission amount of the light emitting element LEL may be increased. The light emitting element LEL may be an organic light emitting diode that includes an organic light emitting layer disposed between an anode electrode and a cathode electrode. In FIG. 11, the anode electrode of the light emitting element LEL corresponds to a pixel electrode 871, and the cathode electrode corresponds to a common electrode 873.

The anode electrode of the light emitting element LEL may be connected to a second electrode of the sixth transistor ST6 and a first electrode of the second transistor ST2, and the cathode electrode may be connected to the second driving voltage line VSSL to which the second driving voltage is applied.

The first transistor ST1 may be turned on by a scan write signal of the scan write line GW to connect the first electrode of the driving transistor DT to the data line DL. Therefore, the data voltage of the data line DL may be applied to the first electrode of the driving transistor DT. A gate electrode of the first transistor ST1 may be connected to the scan write line GW, a first electrode thereof may be connected to the data line DL, and a second electrode thereof may be connected to the first electrode of the driving transistor DT.

The second transistor ST2 may be turned on by a scan write signal of the scan write line GW to connect the anode electrode of the light emitting element LEL to the second initialization voltage line VIL2. A second initialization voltage of the second initialization voltage line VIL2 may be applied to the anode electrode of the light emitting element LEL. A gate electrode of the second transistor ST2 may be connected to the scan write line GW, a first electrode thereof may be connected to the anode electrode of the light emitting element LEL, and a second electrode thereof may be connected to the second initialization voltage line VIL2.

The third transistor ST3 may be turned on by a scan control signal of the scan control line GC to connect the gate electrode with the second electrode of the driving transistor DT. In case that the gate electrode and the second electrode of the driving transistor DT are connected to each other, the driving transistor DT may be driven by a diode. The gate electrode of the third transistor ST3 may be connected to the scan control line GC, the first electrode may be connected to the gate electrode of the driving transistor DT, and the second electrode may be connected to the second electrode of the driving transistor DT.

The fourth transistor ST4 may be turned on by a scan initialization signal of the scan initialization line GI to connect the gate electrode of the driving transistor DT to the first initialization voltage line VIL1. As a result, a first initialization voltage of the first initialization voltage line VIL1 may be applied to the gate electrode of the driving transistor DT. A gate electrode of the fourth transistor ST4 may be connected to the scan initialization line GI, a first electrode thereof may be connected to the first initialization voltage line VIL1, and a second electrode thereof may be connected to the gate electrode of the driving transistor DT.

The fifth transistor ST5 may be turned on by the emission control signal of the emission control line EM to connect the first electrode of the driving transistor DT to the first driving voltage line VDDL to which a first driving voltage is applied. A gate electrode of the fifth transistor ST5 may be connected to the emission control line EM, a first electrode thereof may be connected to the first driving voltage line VDDL, and a second electrode thereof may be connected to the first electrode of the driving transistor DT.

The sixth transistor ST6 may be turned on by the emission control signal of the emission control line EM to connect the second electrode of the driving transistor DT to the anode electrode of the light emitting element LEL. A gate electrode of the sixth transistor ST6 may be connected to the emission control line EM, a first electrode thereof may be connected to the second electrode of the driving transistor DT, and a second electrode thereof may be connected to the anode electrode of the light emitting element LEL.

In case that both the fifth transistor ST5 and the sixth transistor ST6 are turned on, the driving current Isd of the driving transistor DT according to the voltage of the gate electrode of the driving transistor DT may flow to the light emitting element LEL.

The first capacitor C1 may be formed between the gate electrode of the driving transistor DT and the first driving voltage line VDDL. A first capacitor electrode of the first capacitor C1 may be connected to the gate electrode of the driving transistor DT, and a second capacitor electrode thereof may be connected to the first driving voltage line VDDL.

In case that the first electrode of each of the driving transistor DT and the first to sixth transistors ST1, ST2, ST3, ST4, ST5 and ST6 is a source electrode, the second electrode may be a drain electrode. In another embodiment, in case that the first electrode of each of the driving transistor DT and the first to sixth transistors ST1, ST2, ST3, ST4, ST5 and ST6 is a drain electrode, the second electrode may be a source electrode.

An active layer of each of the driving transistor DT and the first to sixth transistors ST1, ST2, ST3, ST4, ST5 and ST6 may be formed of any one of a polysilicon, an amorphous silicon, and an oxide semiconductor. For example, the active layer of each of the driving transistor DT, the first and second transistors ST1 and ST2, and the fifth and sixth transistors ST5 and ST6 may be formed of polysilicon. The active layer of each of the third transistor ST3 and the fourth transistor ST4 may be formed of an oxide semiconductor. The driving transistor DT, the first and second transistors ST1 and ST2, and the fifth and sixth transistors ST5 and ST6 may be formed of P-type MOSFETs, and the third transistor ST3 and the fourth transistor ST4 may be formed of N-type MOSFETs.

Figure 4:
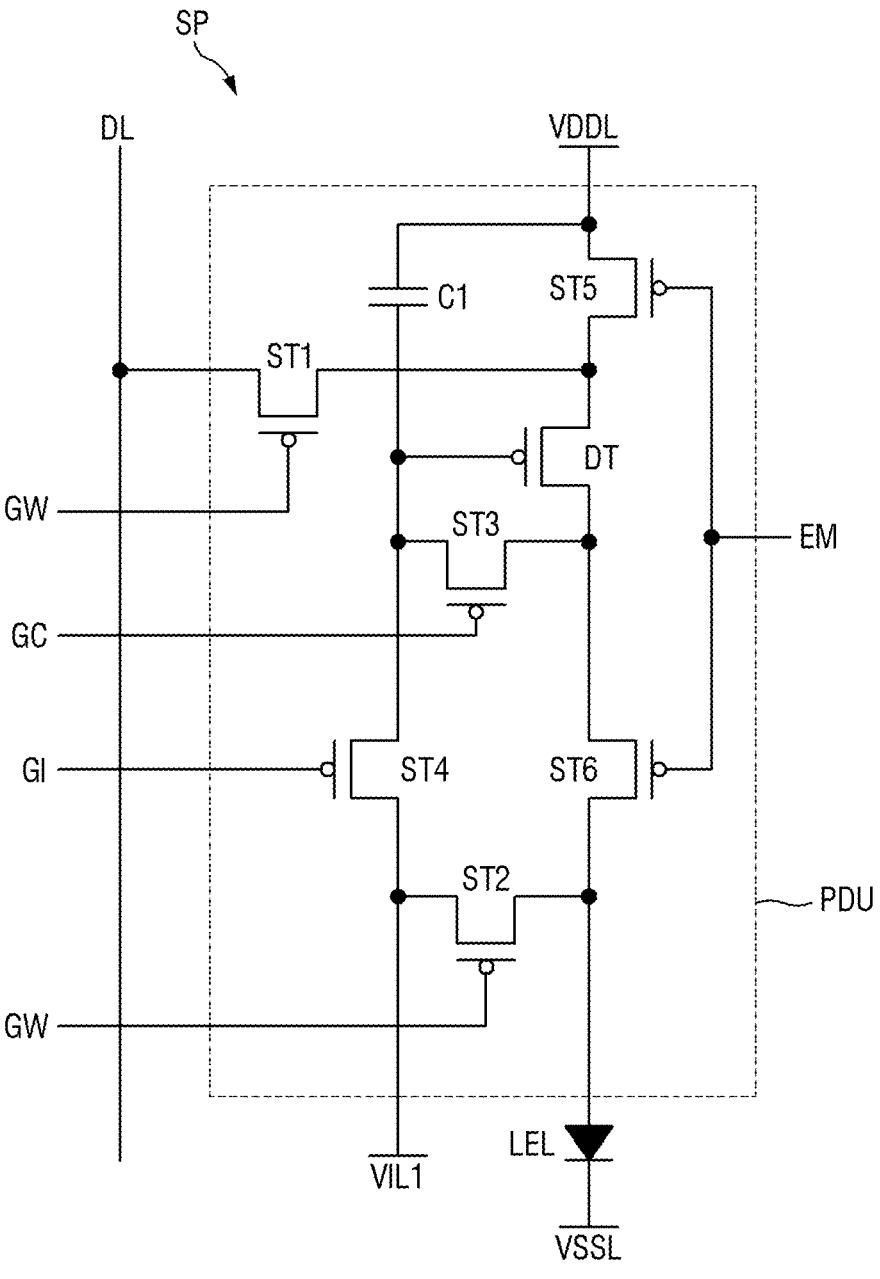
FIG. 4 is a schematic diagram of an equivalent circuit of a subpixel according to another embodiment of the disclosure.

FIG. 4 is a schematic diagram of an equivalent circuit of a subpixel according to another embodiment of the disclosure.

Referring to FIG. 4, in the subpixel SP according to this embodiment, the active layer of each of the driving transistor DT and the first to sixth transistors ST1, ST2, ST3, ST4, ST5 and ST6 may be formed of a polysilicon. The driving transistor DT and the first to sixth transistors ST1, ST2, ST3, ST4, ST5 and ST6 may be formed of P-type MOSFETs.

Figure 5:
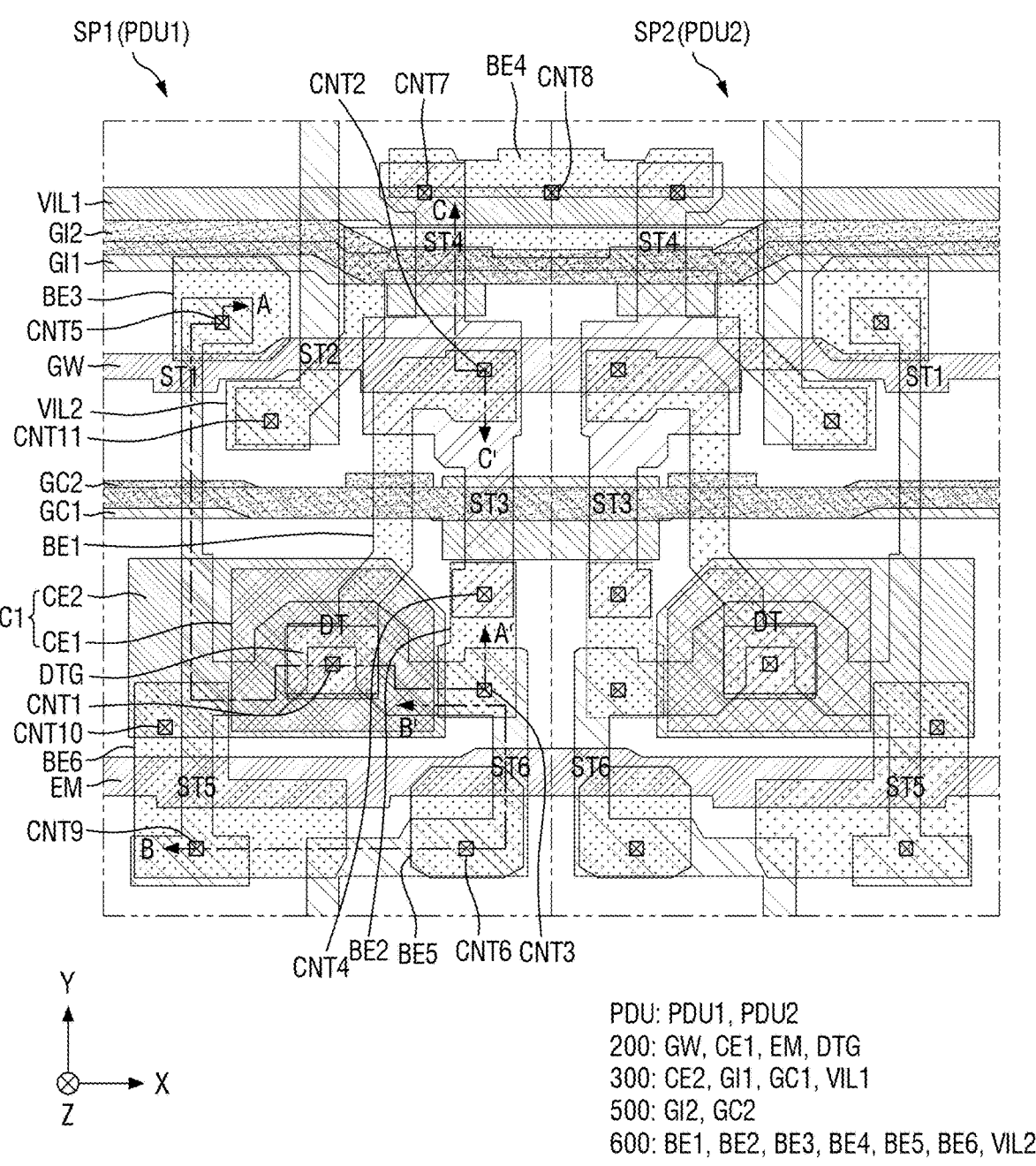
FIG. 5 is a detailed layout view illustrating subpixels according to one embodiment of the disclosure.
Figure 6:
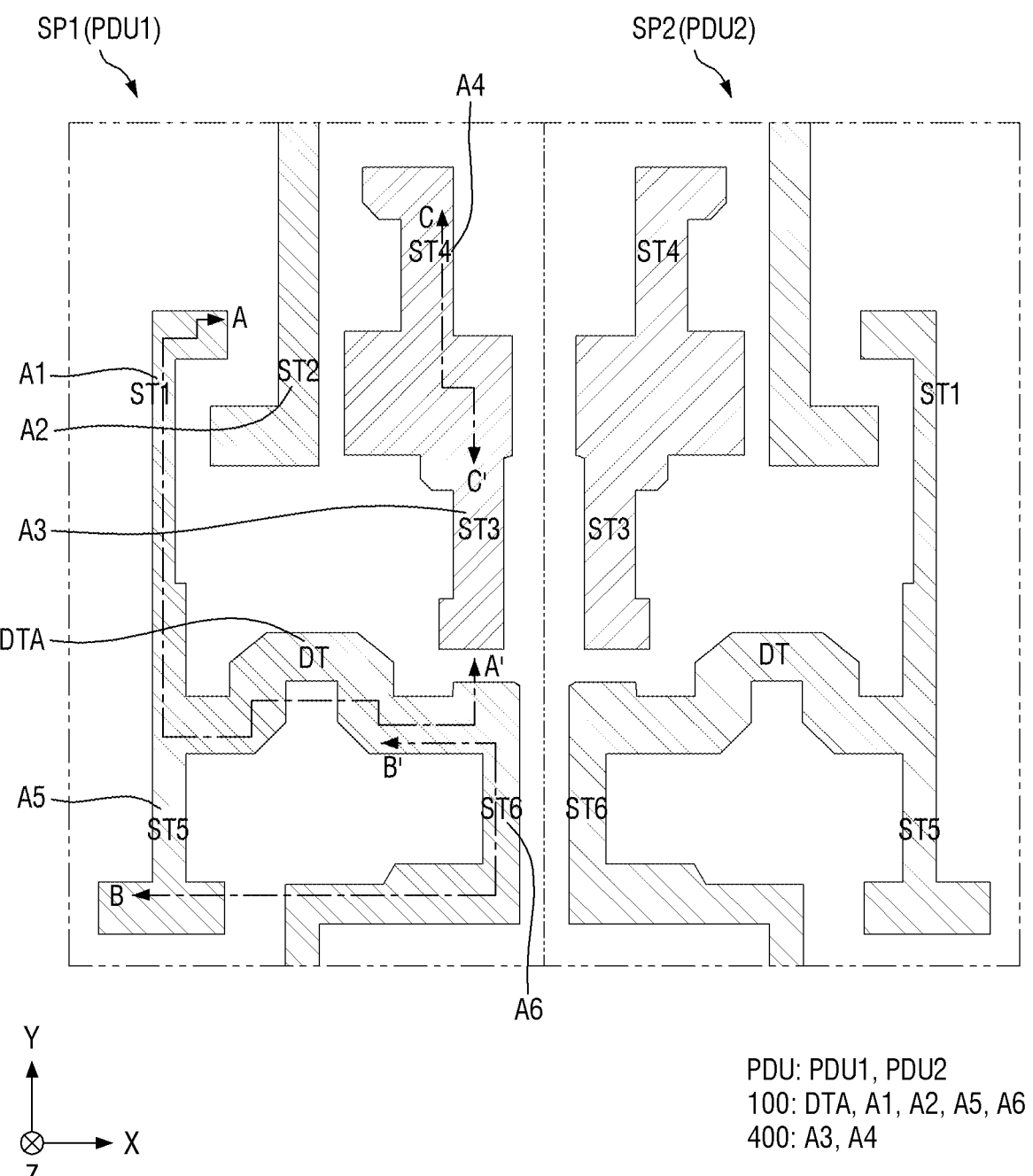
FIG. 6 is a layout view illustrating a semiconductor layer of subpixels according to one embodiment of the disclosure.

FIG. 5 is a detailed layout view illustrating subpixels according to one embodiment of the disclosure. FIG. 6 is a layout view illustrating a semiconductor layer of subpixels according to one embodiment of the disclosure. In FIG. 5, a first semiconductor layer 100, a first gate conductive layer 200, a second gate conductive layer 300, a second semiconductor layer 400, a third gate conductive layer 500, and a first data conductive layer 600 are sequentially stacked along a third direction Z. In FIG. 6, the first semiconductor layer 100 and the second semiconductor layer 400 are stacked each other.

In FIG. 5 and FIG. 6, a first pixel driving part PDU1 of a first subpixel SP1 and a second pixel driving part PDU2 of a second subpixel SP2 are shown. Each of the first pixel driving part PDU1 and the second pixel driving part PDU2 may include a driving transistor DT, first to sixth transistors ST1, ST2, ST3, ST4, ST5 and ST6, and a first capacitor C1. Referring to FIG. 11, a light emitting element LEL emitting first light may be disposed in the first pixel driving part PDU1, and a second light emitting element emitting second light may be disposed in the second pixel driving part PDU2. The first light and the second light may have their respective wavelength bands different from each other, but are not limited thereto.

The first semiconductor layer 100 may include an active area DTA of the driving transistor DT, and active areas A1, A2, A5 and A6 of the first transistor ST1, the second transistor ST2, the fifth transistor ST5 and the sixth transistor ST6. For example, the first semiconductor layer 100 may be formed of a low temperature polycrystalline silicon (LTPS).

Each of the active areas DTA, A1, A2, A5 and A6 may include a channel area overlapping the first gate conductive layer 200, the second gate conductive layer 300 and the third gate conductive layer 500 in the third direction Z, a source area positioned on a side of the channel area, and a drain area positioned on another side of the channel area. The source area and the drain area may have conductivity by doping of impurities in the first semiconductor layer 100.

The first gate conductive layer 200 may include a scan write line GW, a gate electrode DTG of the driving transistor DT, an emission control line EM, and a first capacitor electrode CE1 of the first capacitor C1. The scan write line GW and the emission control line EM may be extended in the first direction X and thus may be spaced apart from each other in the second direction Y. The gate electrode DTG of the driving transistor DT and the first capacitor electrode CE1 may be disposed between the scan write line GW and the emission control line EM. The gate electrode DTG and the first capacitor electrode CE1 may be integral with each other.

The second gate conductive layer 300 may include a first initialization voltage line VIL1, a first scan initialization line GI1, a first scan control line GC1, and a second capacitor electrode CE2. The first initialization voltage line VIL1, the first scan initialization line GI1 and the first scan control line GC1 may be extended in the first direction X, and may be spaced apart from one another in the second direction Y.

The second semiconductor layer 400 may include active areas A3 and A4 of the third transistor ST3 and the fourth transistor ST4. For example, the second semiconductor layer 400 may be made of an oxide semiconductor.

Each of the active areas A3 and A4 may include a channel area overlapping the first gate conductive layer 200, the second gate conductive layer 300 and the third gate conductive layer 500 in the third direction Z, a source area positioned on a side of the channel area, and a drain area positioned on the another of the channel area.

The third gate conductive layer 500 may include a second scan initialization line GI2 and a second scan control line GC2. The second scan initialization line GI2 and the second scan control line GC2 may be extended in the first direction X, and may be spaced apart from each other in the second direction Y.

The second scan initialization line GI2 may overlap the first scan initialization line GI1 in the third direction Z. The same scan initialization signal may be applied to the first scan initialization line GI1 and the second scan initialization line GI2. For example, the first scan initialization line GI1 and the second scan initialization line GI2 may be connected to the scan driver so that the scan initialization signal may be applied thereto, or may be electrically connected to each other through a contact hole so that the scan initialization signal may be applied thereto.

The second scan control line GC2 may overlap the first scan control line GC1 in the third direction Z. The same scan control signal may be applied to the first scan control line GC1 and the second scan control line GC2. For example, the first scan control line GC1 and the second scan control line GC2 may be connected to the scan driver so that the scan control signal may be applied thereto, or may be electrically connected to each other through a contact hole so that the scan control signal may be applied thereto.

The first data conductive layer 600 may include first to sixth connection electrodes BE1, BE2, BE3, BE4, BE5 and BE6, and a second initialization voltage line VIL2. The second initialization voltage line VIL2 may be partially extended in the first direction X, and both ends of the second initialization voltage line VIL2 may be disposed in the first pixel driving part PDU1 and the second pixel driving part PDU2. In other words, the second initialization voltage line VIL2 may be disposed in a disconnected shape for every the two pixel driving parts PDU. As will be described later, the second initialization voltage lines VIL2 spaced apart from each other may be electrically connected to each other through an initialization connection electrode (VIE of FIG. 29).

The gate electrode DTG of the driving transistor DT may overlap the first connection electrode BE1. The gate electrode DTG of the driving transistor DT may be connected to the first connection electrode BE1 through a first contact hole CNT1. A side of the active area DTA of the driving transistor DT may be connected to the active area A1 of the first transistor ST1, and another side thereof may be connected to the second connection electrode BE2 through a third contact hole CNT3.

The active area A1 of the first transistor ST1 may overlap the scan write line GW. The scan write line GW may be the gate electrode of the first transistor ST1. A side of the first transistor ST1 may be connected to the third connection electrode BE3 through a fifth contact hole CNT5, and another side thereof is connected to the active area DTA of the driving transistor DT.

The active area A2 of the second transistor ST2 may overlap the scan write line GW. The scan write line GW may be the gate electrode of the second transistor ST2. A side of the active area A2 of the second transistor ST2 may be connected to the second initialization voltage line VIL2 through an eleventh contact hole CNT11, and another side thereof is connected to the active area A6 of the sixth transistor ST6 of the adjacent subpixel.

The active area A3 of the third transistor ST3 may overlap the first scan control line GC1 and the second scan control line GC2. The first scan control line GC1 and the second scan control line GC2 may be a lower gate electrode and an upper gate electrode of the third transistor ST3, respectively. The third transistor ST3 may be formed in a double gate mode. A side of the active area A3 of the third transistor ST3 may be connected to the second connection electrode BE2 through a fourth contact hole CNT4, and another side thereof may be connected to the first connection electrode BE1 through a second contact hole CNT2.

The active area A4 of the fourth transistor ST4 may overlap the first scan initialization line GI1 and the second scan initialization line GI2. The first scan initialization line GI1 and the second scan initialization line GI2 may be a lower gate electrode and an upper gate electrode of the fourth transistor ST4, respectively. The fourth transistor ST4 may be formed in a double gate mode. A side of the active area A4 of the fourth transistor ST4 may be connected to the fourth connection electrode BE4 through a seventh contact hole CNT7, and another side thereof may be connected to the active area A3 of the third transistor ST3.

The active area A5 of the fifth transistor ST5 may overlap the emission control line EM. The emission control line EM may be a gate electrode of the fifth transistor ST5. A side of the active area A5 of the fifth transistor ST5 may be connected to the second capacitor electrode CE2 through a tenth contact hole CNT10, and another side thereof may be connected to the sixth connection electrode BE6 through a ninth contact hole CNT9.

The active area A6 of the sixth transistor ST6 may overlap the emission control line EM. The emission control line EM may be the gate electrode of the sixth transistor ST6. A side of the active area A6 of the sixth transistor ST6 may be connected to the active area DTA of the driving transistor DT, and another side thereof may be connected to the fifth connection electrode BE5 through a sixth contact hole CNT6.

The first capacitor C1 may include a first capacitor electrode CE1 disposed on the first gate conductive layer 200 and a second capacitor electrode CE2 disposed on the second gate conductive layer 300. The first capacitor electrode CE1 may be a portion of the gate electrode DTG of the driving transistor DT, and the second capacitor electrode CE2 may be connected to the sixth connection electrode BE6 through the tenth contact hole CNT10.

The first connection electrode BE1 may be connected to the gate electrode DTG of the driving transistor DT through the first contact hole CNT1, and may be connected to the active area A3 of the third transistor ST3 and the active area A4 of the fourth transistor ST4 through the second contact hole CNT2.

The second connection electrode BE2 may be connected to the active area DTA of the driving transistor DT through the third contact hole CNT3, and may be connected to the active area A3 of the third transistor ST3 and the active area A4 of the fourth transistor ST4 through the fourth contact hole CNT4.

Figure 13:
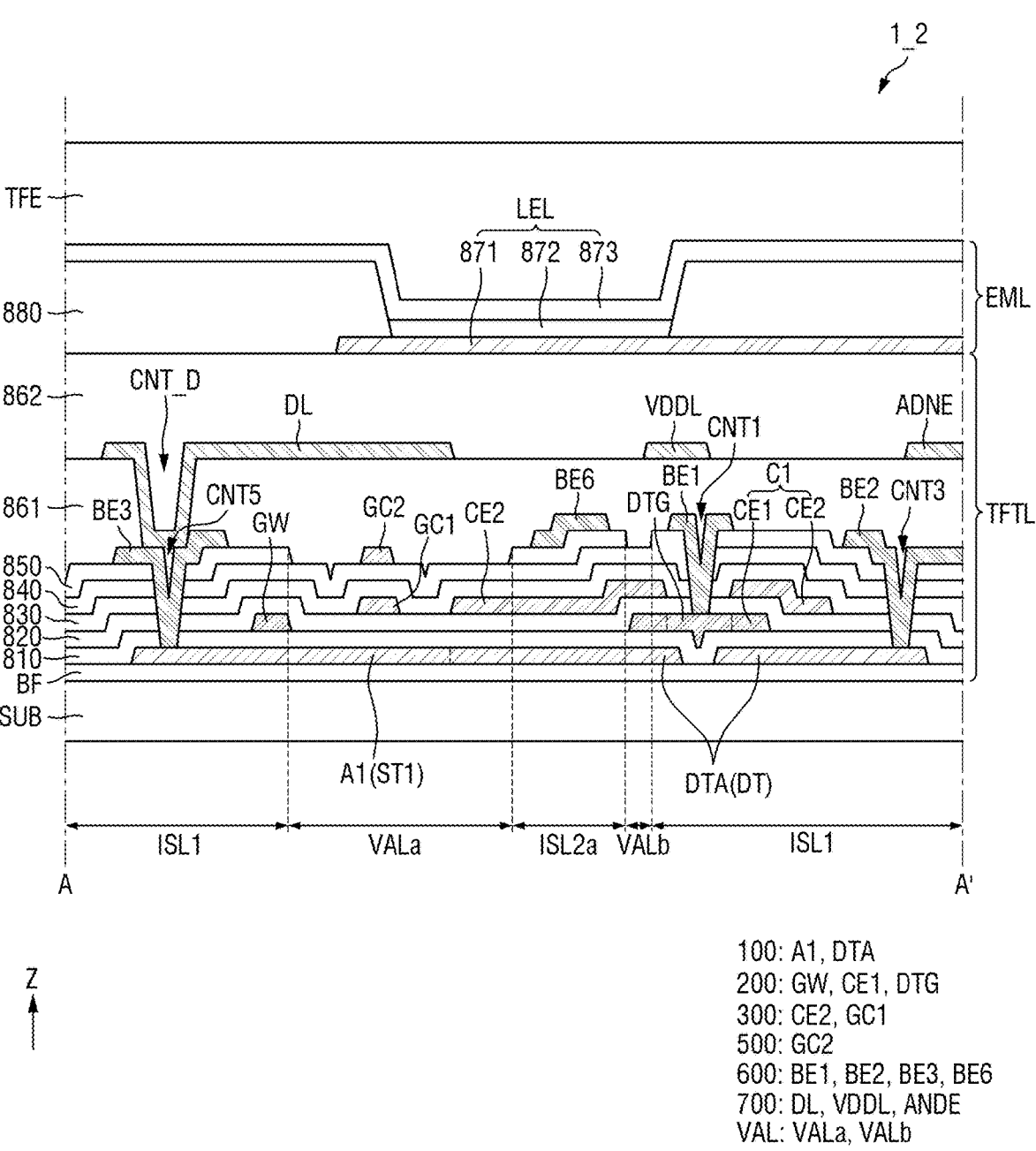
FIG. 13 is a schematic cross-sectional view taken along line A-A' of FIGS. 5, 6 and 10 according to another embodiment of the disclosure.

The third connection electrode BE3 may be connected to the active area A1 of the first transistor ST1 through the fifth contact hole CNT5, and the data line ('DL' of FIG. 10)) may be connected to the third connection electrode BE3 through the fifth contact hole CNT5 (FIG. 13).

The fourth connection electrode BE4 may be connected to the active area A4 of the fourth transistor ST4 through the seventh contact hole CNT7, and may be connected to the first initialization voltage line VIL1 through an eighth contact hole CNT8.

Figure 14:
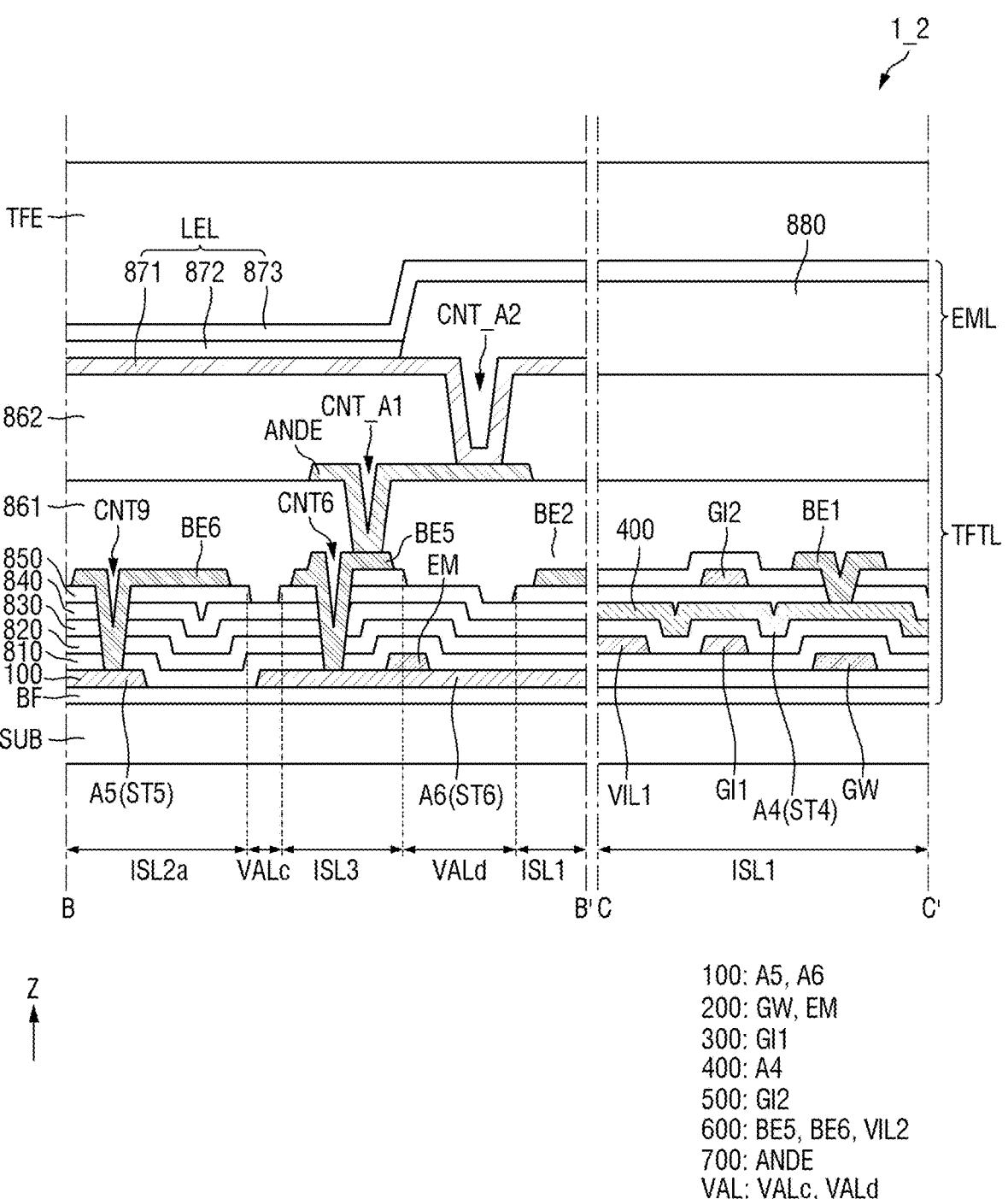
FIG. 14 is a schematic cross-sectional view taken along line B-B' and line C-C' of FIGS. 5, 6 and 10 according to another embodiment of the disclosure.

The fifth connection electrode BE5 may be connected to the active area A6 of the sixth transistor ST6 through the sixth contact hole CNT6, and the anode connection electrode ('ANDE' of FIG. 10) may be connected to the fifth connection electrode BE5 through a first anode contact hole CNT_A1 (FIG. 14).

The sixth connection electrode BE6 may be connected to the active area A5 of the fifth transistor ST5 through the ninth contact hole CNT9, and may be connected to the second capacitor electrode CE2 through the tenth contact hole CNT10. The first driving voltage line ('VDDL' of FIG. 10) may be connected to the sixth connection electrode BE6 through a driving contact hole CNT_V.

The second initialization voltage line VIL2 may be connected to the active area A2 of the second transistor ST2 through the eleventh contact hole CNT11.

Figure 7:
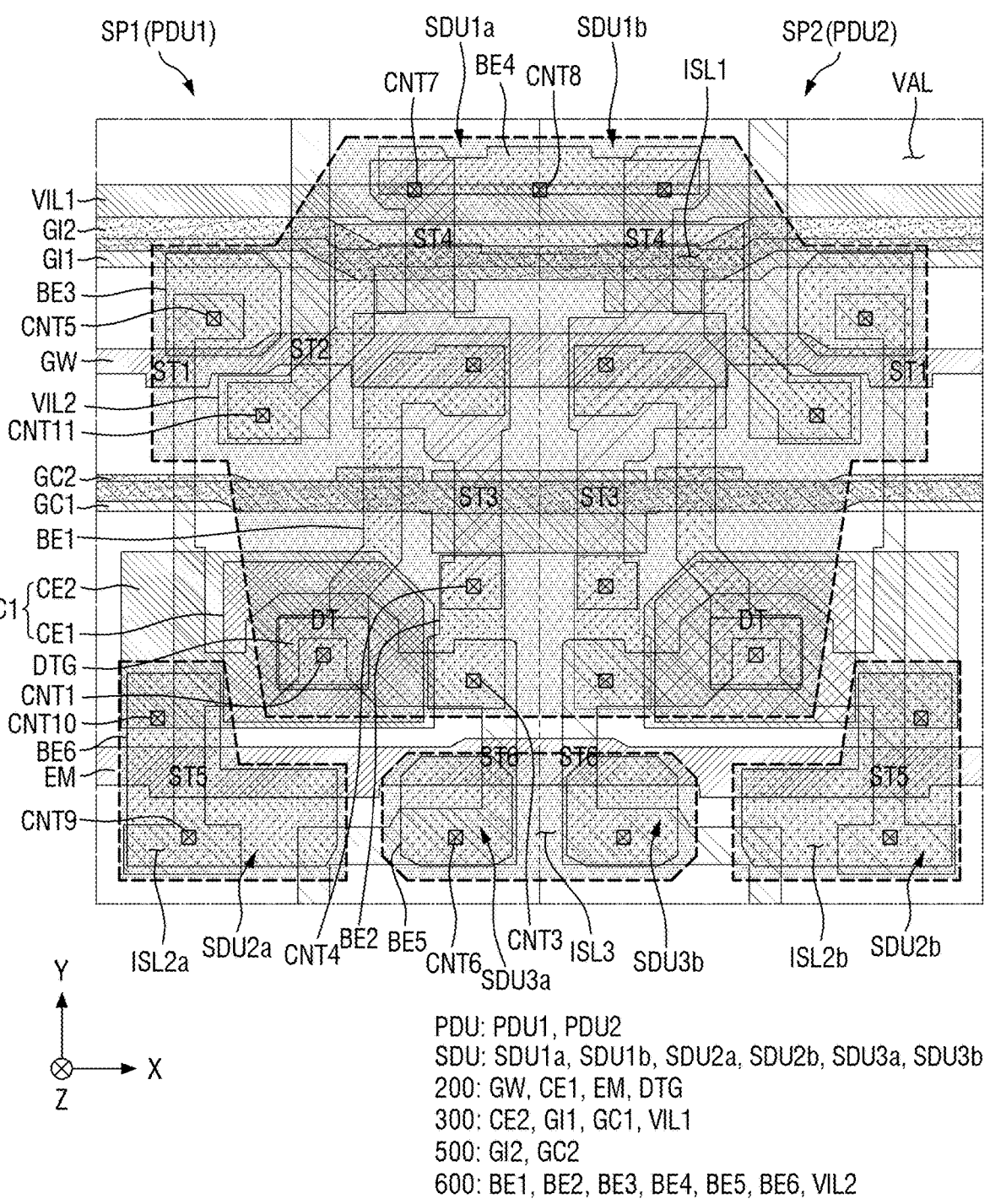
FIG. 7 is a layout view illustrating subpixels, island patterns and a valley according to one embodiment of the disclosure.

FIG. 7 is a layout view illustrating subpixels, island patterns and a valley according to one embodiment of the disclosure.

Referring to FIG. 7, the display device 1 according to the embodiment may include multiple island patterns (or island pattern areas) ISL1, ISL2a, ISL2b and ISL3, and valley (or valley area) VAL that partitions the island patterns ISL1, ISL2a, ISL2b and ISL3. As described in FIG. 11, the valley VAL may be an area that does not overlap the first data conductive layer 600 after the first data conductive layer 600 is patterned, and may be defined as an area in which multiple insulating layers 820, 830, 840 and 850 are etched to expose a portion of the plurality of gate conductive layers 200, 300 and 500. Some of the exposed gate conductive layers 200, 300 and 500 may be in contact with a first passivation layer 861 formed of an organic layer. For example, the valley VAL may not overlap the first to sixth connection electrodes BE1 to BE6 of the first data conductive layer 600 and the second initialization voltage line VIL2.

Each of the island patterns ISL1, ISL2a, ISL2b and ISL3 partitioned by the valley VAL may overlap the first data conductive layer 600. Each of these island patterns may be disposed in the pixel driving part PDU in various shapes depending on a planar arrangement structure of the first data conductive layer 600, and various modifications may be made in the number of the island patterns.

For example, the first island pattern ISL1 may overlap the first connection electrode BE1, the second connection electrode BE2, the third connection electrode BE3, the fourth connection electrode BE4, and the second initialization voltage line VIL2. The second island patterns ISL2a and ISL2b may overlap the sixth connection electrode BE6, respectively. The third island pattern ISL3 may overlap the fifth connection electrode BE5.

The island patterns ISL1, ISL2a, ISL2b and ISL3 may be disposed in the first pixel driving part PDU1 of the first subpixel SP1 or the second pixel driving part PDU2 of the second subpixel SP2, or may be disposed over the two pixel driving parts PDU. For example, the island patterns ISL1, ISL2a, ISL2b and ISL3 may be disposed over the first pixel driving part PDU1 and the second pixel driving part PDU2.

The island patterns ISL1, ISL2a, ISL2b and ISL3 may include a first island pattern ISL1, two second island patterns ISL2a and ISL2b, and a third island pattern ISL3. The first island pattern ISL1 may be formed over a portion of the first pixel driving part PDU1 and a portion of the second pixel driving part PDU2. The second a island pattern ISL2a may be disposed over a portion of the first pixel driving part PDU1, and the second b island pattern ISL2b may be disposed over a portion of the second pixel driving part PDU2. The third island pattern ISL3 may be formed over a portion of the first pixel driving part PDU1 and a portion of the second pixel driving part PDU2.

The pixel driving part PDU may include multiple subpixel driving parts SDU depending on areas in which the respective island patterns ISL1, ISL2a, ISL2b and ISL3 are disposed. The first pixel driving part PDU1 may include a first a subpixel driving part SDU1a, a second a subpixel driving part SDU2a, and a third a subpixel driving part SDU3a, and the second pixel driving part PDU2 may include a first b subpixel driving part SDU1b, a second b subpixel driving part SDU2b, and a third b subpixel driving part SDU3b. An area of each subpixel driving part SDU may be smaller than that of the pixel driving part PDU.

The transistors included in the respective subpixel driving parts SDU may be different from each other, and the number of transistors may be different in the respective subpixel driving parts SDU. Each of the first subpixel driving parts SDU1a and SDU1b may include a driving transistor DT and first to fourth transistors ST1, ST2, ST3, and ST4. The second subpixel driving parts SDU2a and SDU2b may include a fifth transistor ST5, and the third subpixel driving parts SDU3a and SDU3b may include a sixth transistor ST6.

The subpixel driving parts SDUs may be disposed in the respective island patterns ISL1, ISL2a, ISL2b and ISL3. For example, the first a subpixel driving part SDU1a of the first pixel driving part PDU1 and the first b subpixel driving part SDU1b of the second pixel driving part PDU2 may be disposed in the first island pattern ISL1. The second a subpixel driving part SDU2a of the first pixel driving part PDU1 or the second b subpixel driving part SDU2b of the second pixel driving part PDU2 may be disposed in the second island patterns ISL2a and ISL2b. The third a subpixel driving part SDU3a of the first pixel driving part PDU1 and the third b subpixel driving part SDU3b of the second pixel driving part PDU2 may be disposed in the third island pattern ISL3.

Therefore, apart from the different number of transistors included in the respective subpixel driving parts SDU, the number of transistors included in the respective island patterns ISL1, ISL2a, ISL2b and ISL3 may be also different. In the embodiment, the first island pattern ISL1 may include ten transistors over the first pixel driving part PDU1 and the second pixel driving part PDU2, and each of the second island patterns ISL2a and ISL2b may include one transistor, and the third island pattern ISL3 may include two transistors over the first pixel driving part PDU1 and the second pixel driving part PDU2, but the embodiment is not limited thereto.

The areas of the respective island patterns ISL1, ISL2a, ISL2b and ISL3 may be different from each other, and the areas of the respective subpixel driving parts SDU may be different from each other.

In the display device 1 according to the embodiment, as the valley VAL from which the insulating layers 820, 830, 840 and 850 positioned on the gate conductive layers 200, 300 and 500 are removed is formed, transfer of external impact by an inorganic insulating layer may be suppressed or avoided. The external impact may be, for example, an impact when the display device 1 is dropped, an impact when a touch input member or the like is dropped on the display device 1, but is not limited thereto. Since the external impact may be primarily transferred through the inorganic insulating layer, transfer of external impact may be suppressed or avoided in case that the area where the inorganic insulating layer is disposed is reduced or the inorganic insulating layer is discontinuously disposed.

On the other hand, although the valley VAL may suppress the transfer of external impact as described above, in case that an additional valley area is formed in the pixel driving part PDU to form the valley VAL, resolution of the display device may be reduced.

The display device 1 according to the embodiment may include multiple island patterns ISL1, ISL2a, ISL2b and ISL3 disposed in multiple subpixel driving parts SDU having a smaller area than the pixel driving part PDU. Therefore, as a separate area for forming the valley VAL in the pixel driving part PDU is minimized, resolution of the display device 1 may be prevented from being reduced.

Figure 8:
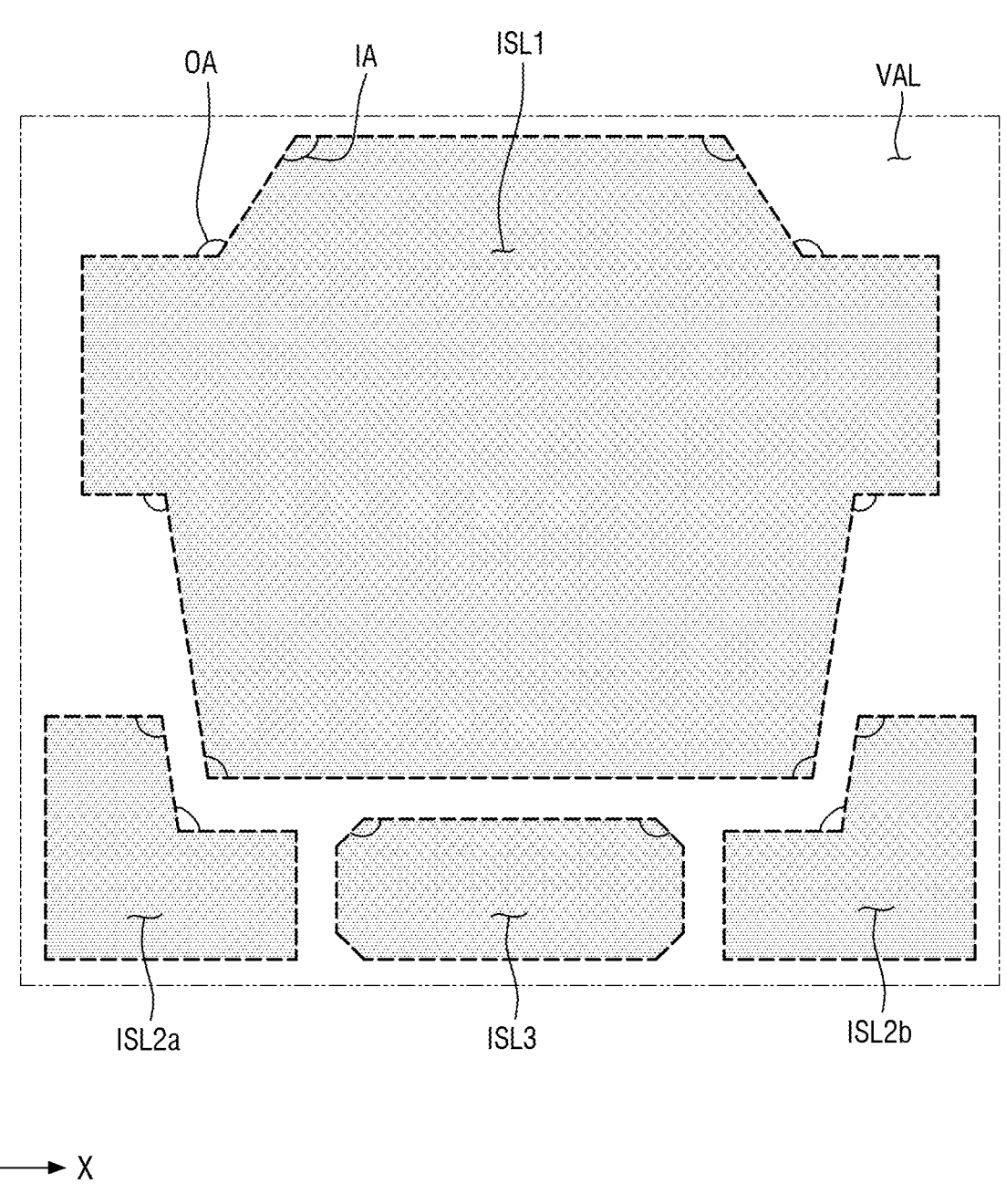
FIG. 8 is a layout view illustrating the island patterns and the valley of FIG. 7.

FIG. 8 is a layout view illustrating the island patterns and the valley of FIG. 7.

The display device 1 according to one embodiment of the disclosure may include a first island pattern ISL1, second island patterns ISL2a and ISL2b, a third island pattern ISL3, and a valley VAL that partitions them.

Each of the island patterns ISL1, ISL2a, ISL2b and ISL3 may have a planar polygonal shape. Although FIG. 8 illustrate that the first island pattern ISL1 has a planar dodecagonal shape, the second island patterns ISL2a and ISL2b have a planar hexagonal shape, and the third island pattern ISL3 has a planar octagonal shape, the disclosure is not limited thereto. For example, each of the island patterns ISL1, ISL2a, ISL2b and ISL3 may have a planar rectangular shape, or other polygonal shape.

In the embodiment, each of the island patterns ISL1, ISL2a, ISL2b and ISL3 may have a polygonal shape in which an outer angle OA and an inner angle IA, which are defined by two adjacent sides, are 90° or more. The outer angle OA and the inner angle IA of each of the island patterns ISL1, ISL2a, ISL2b and ISL3 may be 90° or more, or any one thereof may be 90° or more.

The valley VAL may suppress transfer of external impact as described above, but multiple transistors may be applied with stress in the process of etching the inorganic insulating layer. In particular, in case that the inner angle of the valley VAL (i.e., the outer angle OA of the island pattern) is 90° or less, stress may be concentrated on the transistors. In other words, as a width of the valley VAL becomes narrow, stress may be concentrated on the transistors.

In the display device 1 according to the embodiment, since the island patterns ISL1, ISL2a, ISL2b and ISL3 have a polygonal shape in which the inner angle IA and/or the outer angle OA is 90° or more, stress that may occur in the valley VAL may be minimized.

When the inorganic insulating layer is etched to form the valley VAL as described above, since stress may be concentrated on the transistors, the island patterns ISL1, ISL2a, ISL2b and ISL3, each of which has a shape that minimizes stress, need to be formed.

For example, referring to FIG. 7, a portion of the island patterns ISL1, ISL2a, ISL2b and ISL3 may be disposed in the active area A1 of the first transistor ST1 and the active area A2 of the second transistor ST2, which overlap the scan write line GW in the third direction Z. In case that a defect occurs in the process of removing the inorganic insulating layer included in the first transistor ST1 and the second transistor ST2, bright or dark points of the light emitting element may occur. Therefore, the first island pattern ISL1 may be disposed in the first transistor ST1 and the second transistor ST2.

A portion of the island patterns ISL1, ISL2a, ISL2b and ISL3 may be disposed in the second semiconductor layer 400. The oxide semiconductor included in the second semiconductor layer 400 may be sensitive to an etching environment of the inorganic insulating layer. Therefore, the inorganic insulating layer disposed on the active area A3 of the third transistor ST3 and the active area A4 of the fourth transistor ST4 may not be removed. Therefore, the first island pattern ISL1 may be disposed in the third transistor ST3 and the fourth transistor ST4.

In other words, the valley VAL may not be disposed in the first transistor ST1, the second transistor ST2, the third transistor ST3 and the fourth transistor ST4, but the disclosure is not limited thereto.

Figure 9:
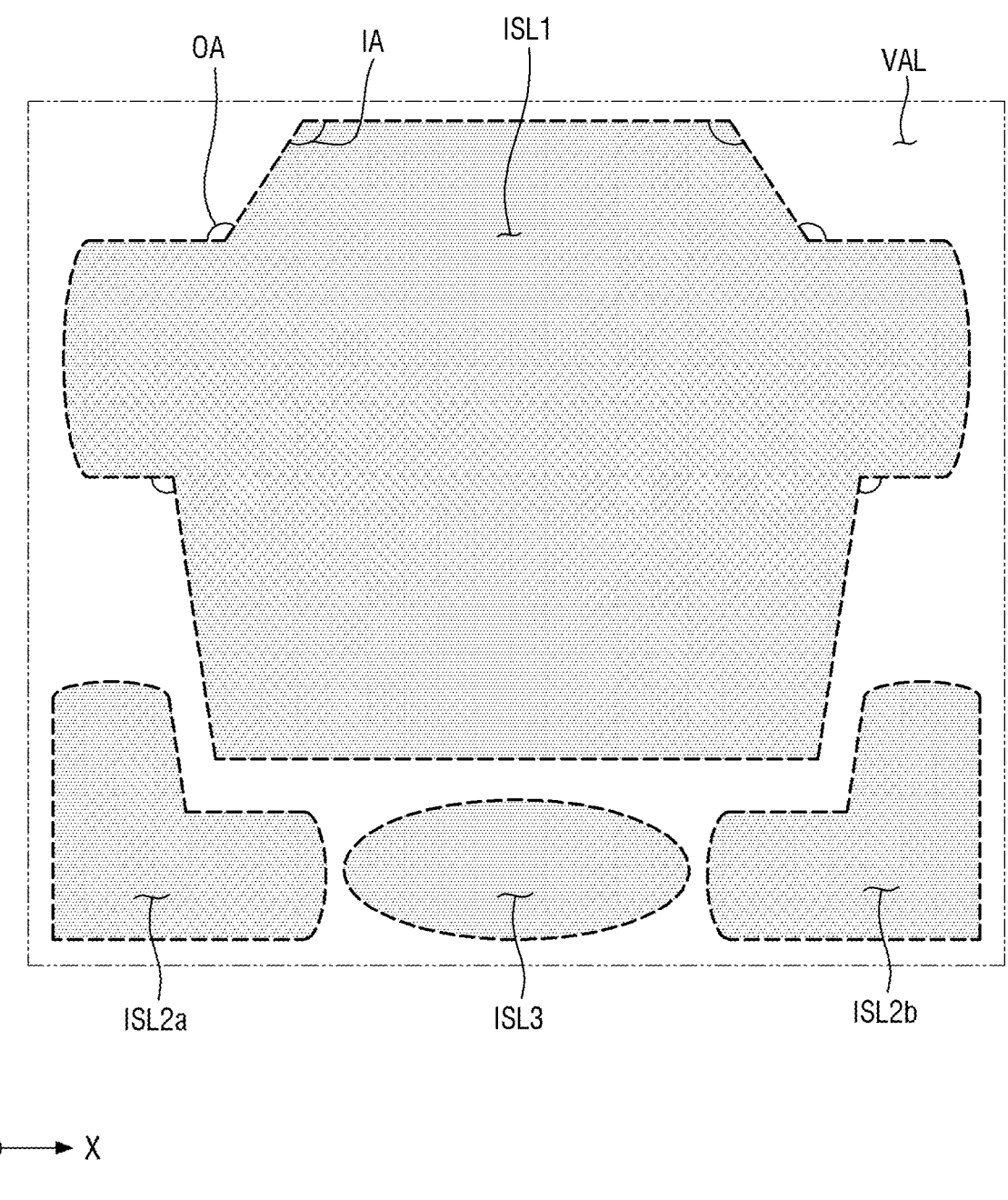
FIG. 9 is a layout view illustrating island patterns and a valley according to another embodiment of the disclosure.

FIG. 9 is a layout view illustrating island patterns and a valley according to another embodiment of the disclosure.

The display device 1 according to the embodiment is different from that of the previous embodiment in that the first island pattern ISL1, the second island patterns ISL2a and ISL2b and the third island pattern ISL3 include a planar curved portion.

The embodiment is the same as the previous embodiment in that the display device 1 according to the embodiment may include a portion in which the outer angle OA and the inner angle IA defined by two adjacent sides of the first island pattern ISL1, the second island patterns ISL2a and ISL2b and the third island pattern ISL3 are respectively 90° or more.

The island patterns of the display device 1 according to the embodiment may include a planar circular or elliptical shape like the third island pattern ISL3.

Figure 10:
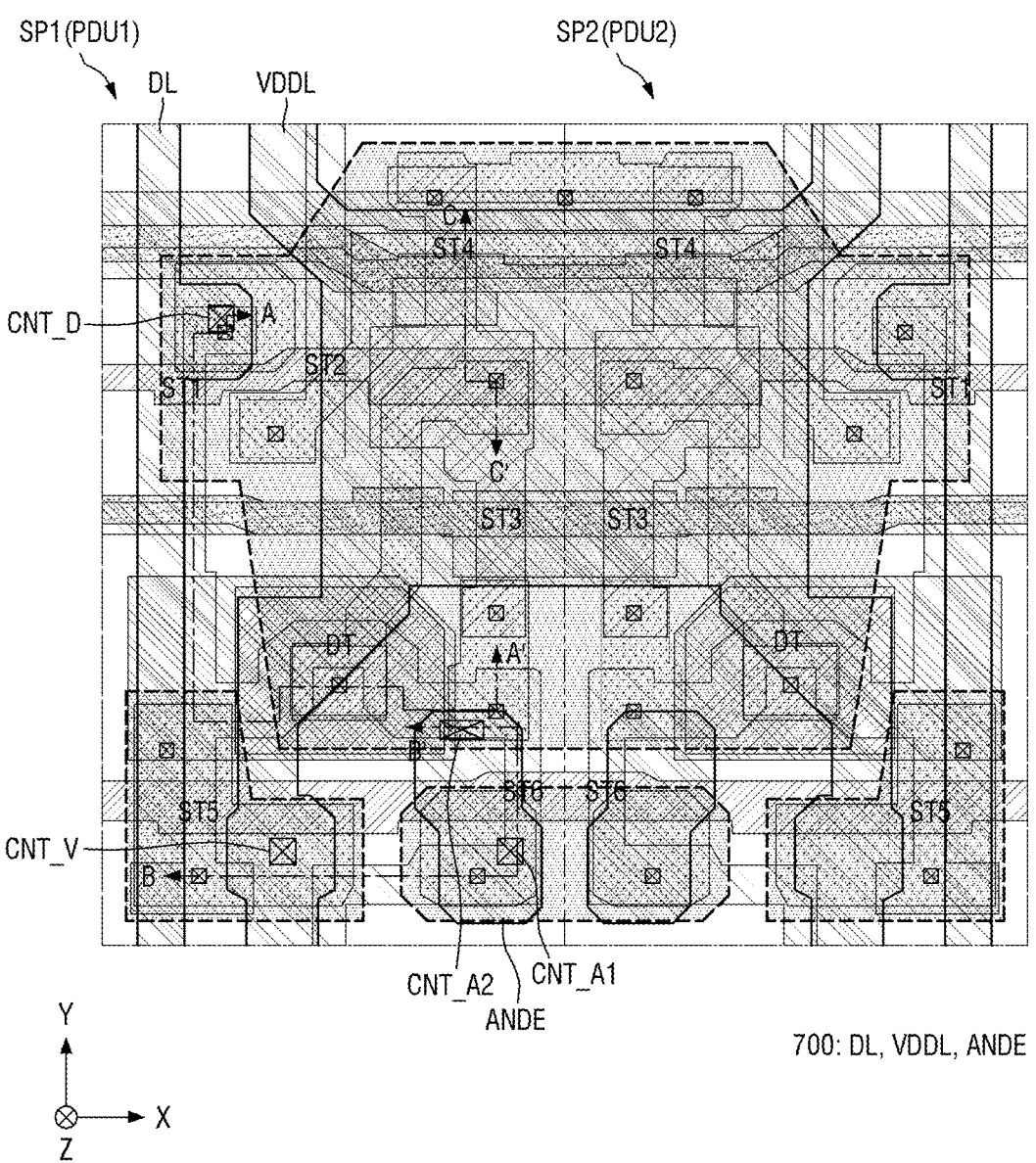
FIG. 10 is a layout view illustrating a second data conductive layer according to an embodiment of the disclosure.

FIG. 10 is a layout view illustrating a second data conductive layer according to an embodiment of the disclosure.

Referring to FIG. 10, a second data conductive layer 700 may be further disposed in FIG. 7.

The second data conductive layer 700 may include a data line DL, a first driving voltage line VDDL, and an anode connection electrode ANDE. The data line DL and the first driving voltage line VDDL may be extended in the second direction Y.

The data line DL may be connected to the third connection electrode BE3 through a data contact hole CNT_D. The first driving voltage line VDDL may be connected to the sixth connection electrode BE6 through a driving contact hole CNT_V. The anode connection electrode ANDE may be connected to the fifth connection electrode BE5 through the first anode contact hole CNT_A1. The pixel electrode ('871' of FIG. 11) may be connected to the anode connection electrode ANDE through a second anode contact hole CNT_A2.

Figure 12:
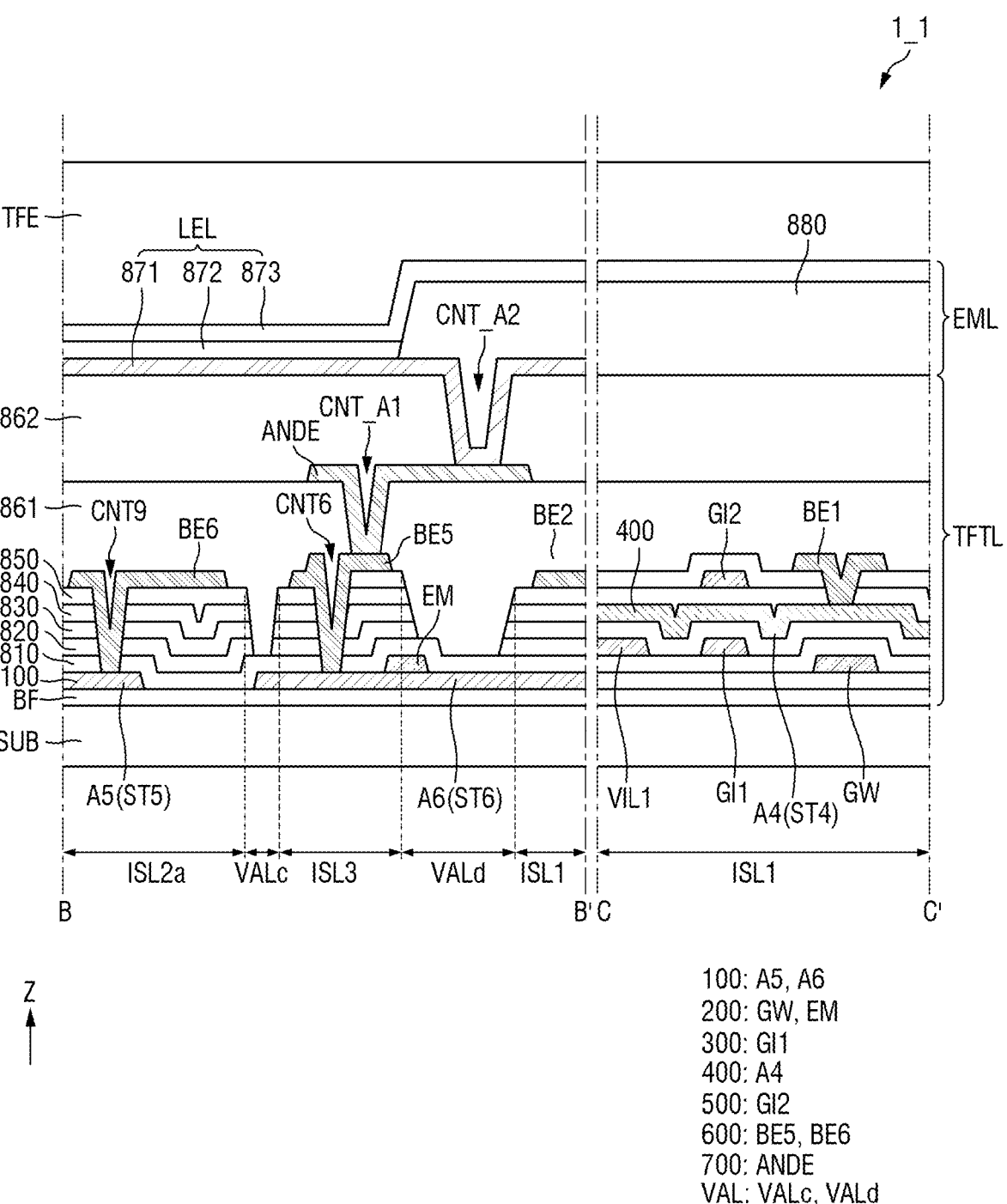
FIG. 12 is a schematic cross-sectional view taken along line B-B' and line C-C' of FIGS. 5, 6 and 10 according to an embodiment of the disclosure.

FIG. 11 is a schematic cross-sectional view taken along line A-A' of FIGS. 5, 6 and 10 according to an embodiment of the disclosure. FIG. 12 is a schematic cross-sectional view taken along line B-B' and line C-C' of FIGS. 5, 6 and 10 according to an embodiment of the disclosure.

Referring to FIGS. 11 and 12, a thin film transistor layer TFTL, a light emitting element layer EML, and an encapsulation layer TFE may be sequentially formed on a substrate SUB.

The thin film transistor layer TFTL may be disposed in the order of the buffer layer BF, the first semiconductor layer 100, a first insulating layer 810, the first gate conductive layer 200, a second insulating layer 820, the second gate conductive layer 300, a third insulating layer 830, the second semiconductor layer 400, a fourth insulating layer 840, the third gate conductive layer 500, a fifth insulating layer 850, the first data conductive layer 600, the first passivation layer 861, the second data conductive layer 700, and a second passivation layer 862.

The substrate SUB may serve to support the respective layers disposed on the substrate SUB. In case that the substrate SUB is a flexible substrate having flexibility, the substrate SUB may include polyimide, but is not limited thereto. In case that the substrate SUB is a rigid substrate having rigidity, the substrate SUB may include glass, but is not limited thereto.

The buffer layer BF may be disposed on one surface of the substrate SUB. The buffer layer BF may be formed on one surface of the substrate SUB to protect the thin film transistor layer TFTL and a light emitting layer 872 of the light emitting element layer from moisture permeated through the substrate SUB vulnerable to moisture permeation.

The first semiconductor layer 100 may be disposed on the buffer layer BF. The first semiconductor layer 100 may include a silicon semiconductor such as a polycrystalline silicon, a monocrystalline silicon, a low temperature polycrystalline silicon, and a amorphous silicon. The first semiconductor layer 100 may include an active area DTA of the driving transistor DT and active areas A1, A2, A5 and A6 of the first transistor ST1, the second transistor ST2, the fifth transistor ST5 and the sixth transistor ST6.

Although the channel area, the source area and the drain area of the first semiconductor layer 100 are not shown, in FIG. 11, the active area A1 of the first transistor ST1 may include a channel area overlapping the scan write line GW in the third direction Z, a source area positioned on a side of the channel area, and a drain area positioned on another side of the channel area. The active area DTA of the driving transistor DT may include a channel area overlapping the gate electrode DTG of the driving transistor DT in the third direction Z, a source area positioned on a side of the channel area, and a drain area positioned on another side of the channel area. Also, in FIG. 12, the active area A6 of the sixth transistor ST6 may include a channel area overlapping the emission control line EM in the third direction Z, a source area positioned on a side of the channel area, and a drain area positioned on another side of the channel area.

The first insulating layer 810 may be disposed on the first semiconductor layer 100. The first insulating layer 810 may be an inorganic layer, for example, a silicon nitride layer, a silicon oxynitride layer, a silicon oxide layer, a titanium oxide layer, or an aluminum oxide layer.

The first gate conductive layer 200 may be disposed on the first insulating layer 810. The first gate conductive layer 200 may include a gate electrode DTG of the driving transistor DT, a first capacitor electrode CE1, a scan write line GW, and an emission control line EM. The first gate conductive layer 200 may be formed of a single layer or multi-layer made of at least one of molybdenum (Mo), aluminum (Al), chromium (Cr), gold (Au), titanium (Ti), nickel (Ni), neodymium (Nd) and copper (Cu), or their alloy.

The second insulating layer 820 may be disposed on the first gate conductive layer 200. The second insulating layer 820 may be an inorganic layer, for example, a silicon nitride layer, a silicon oxynitride layer, a silicon oxide layer, a titanium oxide layer, or an aluminum oxide layer.

The second gate conductive layer 300 may be disposed on the second insulating layer 820. The second gate conductive layer 300 may include a second capacitor electrode CE2, a first scan initialization line GI1, a first scan control line GC1, and a first initialization voltage line VIL1. The second gate conductive layer 300 may be formed of a single layer or multi-layer made of at least one of molybdenum (Mo), aluminum (Al), chromium (Cr), gold (Au), titanium (Ti), nickel (Ni), neodymium (Nd) and copper (Cu), or their alloy.

The third insulating layer 830 may be disposed on the second gate conductive layer 300. The third insulating layer 830 may be an inorganic layer, for example, a silicon nitride layer, a silicon oxynitride layer, a silicon oxide layer, a titanium oxide layer, or an aluminum oxide layer.

The second semiconductor layer 400 may be disposed on the third insulating layer 830. The second conductive layer 400 may include the active area A4 of the fourth transistor ST4. The second semiconductor layer 400 may include an oxide semiconductor such as IGZO (indium (In), gallium (Ga), zinc (Zn) and oxygen (O)), IGZTO (indium (In), gallium (Ga), zinc (Zn), tin (Sn) and oxygen (O)), or IGTO (indium (In), gallium (Ga), tin (Sn) and oxygen (O)).

Although the channel area, the source area and the drain area of the fourth transistor ST4 are not shown, in FIG. 12, the active area A4 of the fourth transistor ST4 may include a channel area overlapping the first scan initialization line GI1 and the second scan initialization line GI2 in the third direction Z, a source area positioned on a side of the channel area, and a drain area positioned on another side of the channel area.

The fourth insulating layer 840 may be disposed on the second semiconductor layer 400. The fourth insulating layer 840 may be an inorganic layer, for example, a silicon nitride layer, a silicon oxynitride layer, a silicon oxide layer, a titanium oxide layer, or an aluminum oxide layer.

The third gate conductive layer 500 may be disposed on the fourth insulating layer 840. The third gate conductive layer 500 may include a second scan initialization line GI2 and a second scan control line GC2. The third gate conductive layer 500 may be formed of a single layer or multi-layer formed of at least one of molybdenum (Mo), aluminum (Al), chromium (Cr), gold (Au), titanium (Ti), nickel (Ni), neodymium (Nd), and copper (Cu), or an alloy thereof.

The fifth insulating layer 850 may be disposed on the third gate conductive layer 500. The fifth insulating layer 850 may be an inorganic layer, for example, a silicon nitride layer, a silicon oxynitride layer, a silicon oxide layer, a titanium oxide layer, or an aluminum oxide layer.

The first data conductive layer 600 may be formed on the fifth insulating layer 850. The first data conductive layer 600 may include a second initialization voltage line VIL2 and first to sixth connection electrodes BE1 to BE6. The first data conductive layer 600 may be formed of a single layer or multi-layer made of at least one of molybdenum (Mo), aluminum (Al), chromium (Cr), gold (Au), titanium (Ti), nickel (Ni), neodymium (Nd) and copper (Cu), or their alloy.

The first passivation layer 861 may be formed on the first data conductive layer 600 to planarize a step difference due to the first semiconductor layer 100, the second semiconductor layer 400, the first gate conductive layer 200, the second gate conductive layer 300, the third gate conductive layer 500 and the first data conductive layer 600. The first passivation layer 861 may be an organic layer including a material such as an acrylic resin, an epoxy resin, a phenolic resin, a polyamide resin, or a polyimide resin.

The display device 1 according to the embodiment may include multiple island patterns ISL1, ISL2a and ISL3, and a valley VAL disposed therebetween in a subpixel.

The island patterns ISL1, ISL2a and ISL3 may include a first semiconductor layer 100, a first insulating layer 810, a first gate conductive layer 200, a second insulating layer 820, a second gate conductive layer 300, a third insulating layer 830, a second semiconductor layer 400, a fourth insulating layer 840, a third gate conductive layer 500, a fifth insulating layer 850 and a first data conductive layer 600 of the thin film transistor layer TFTL. The first data conductive layer 600 included in the island patterns ISL1, ISL2a and ISL3 may be covered by the first passivation layer 861.

The valley VAL may include a first semiconductor layer 100, a first insulating layer 810, a first gate conductive layer 200, a second insulating layer 820, and a second gate conductive layer 300. The valley VAL may be formed in an area that does not overlap the first data conductive layer 600. For example, in FIG. 11, valleys VALa and VALb may be formed in an area that does not overlap the first to third connection electrodes BE1, BE2 and BE3, and the sixth connection electrode BE6. Also, in FIG. 12, valleys VALc and VALd may be formed in an area that does not overlap the fifth and sixth connection electrodes BE5 and BE6, and the second initialization voltage line VIL2.

The valley VAL may not be formed in an area overlapping the second semiconductor layer 400. For example, in FIG. 12, the valley VAL may not be formed in an area overlapping the active area A4 of the fourth transistor ST4.

The second gate conductive layer 300 disposed in the valley VAL may be exposed by an etching process. The first passivation layer 861 disposed in the valley VAL may be directly in contact with an upper surface of the second gate conductive layer 300. For example, the valley VAL may not overlap the third insulating layer 830, the fourth insulating layer 840, and the fifth insulating layer 850. For example, the third insulating layer 830, the fourth insulating layer 840, and the fifth insulating layer 850 may be etched to expose the second gate conductive layer 300 in the valleys VALa and VALb.

In case that the second gate conductive layer 300 is not disposed in the valley VAL, the third insulating layer 830, the fourth insulating layer 840, and the fifth insulating layer 850 may be etched to expose the second insulating layer 820. For example, valleys VALa, VALc and VALd may include the exposed second insulating layer 820. The exposed upper surface of the second insulating layer 820 may be directly in contact with the first passivation layer 861. A thickness of the second insulating layer 820 disposed in the valleys VALa, VALc and VALd may be thinner than that of the second insulating layer 820 disposed on the valley VALb or the island patterns ISL1, ISL2a and ISL3, but is not limited thereto.

In case that the third gate conductive layer 500 overlapping the second gate conductive layer 300 in the third direction Z is disposed in the valley VAL, the upper surface of the second gate conductive layer 300 may not be exposed. For example, in case that the first scan control line GC1 of the second gate conductive layer 300 and the second scan control line GC2 of the third gate conductive layer 500 overlap each other in the VALa, the valley VALa may overlap the third insulating layer 830 and the fourth insulating layer 840. The upper surface of the second scan control line GC2 disposed in the valley VAL may be exposed, and may be covered by the first passivation layer 861. For example, dry etching may be performed using the second scan control line GC2 as an etching mask.

According to the embodiment, as a portion of the insulating layers 830, 840 and 850, which does not overlap the first data conductive layer 600, is removed, an area in which the inorganic insulating layer is disposed may be minimized. These insulating layers 830, 840 and 850 may include a discontinuous portion in at least a portion.

The first passivation layer 861 may be in direct contact with the upper surfaces of the second gate conductive layer 300 and the second insulating layer 820, which are exposed in the valley VAL. The first passivation layer 861 may be directly in contact with sides of the third insulating layer 830 and the fourth insulating layer 840, which are exposed in the valley VAL, and may be directly in contact with the upper surface and the side of the third gate conductive layer 500 (e.g., the second scan control line GC2).

The first passivation layer 861 may protect the semiconductor layers 100 and 400 and the first to third gate conductive layers 200, 300 and 500 from external impact, and may reduce stress applied to the insulating layers 830, 840 and 850. For example, the valley VAL may protect the island patterns ISL1, ISL2a and ISL3 from external impact.

The second data conductive layer 700 may be formed on the first passivation layer 861. The second data conductive layer 700 may include an anode connection electrode ANDE, a data line DL, and a first driving voltage line VDDL1. The second data conductive layer 700 may be formed of a single layer or multi-layer made of at least one of molybdenum (Mo), aluminum (Al), chromium (Cr), gold (Au), titanium (Ti), nickel (Ni), neodymium (Nd) and copper (Cu), or their alloy.

The second passivation layer 862 may be formed on the second data conductive layer 700 to planarize a step difference. The second passivation layer 862 may be an organic layer including a material such as an acrylic resin, an epoxy resin, a phenolic resin, a polyamide resin, or a polyimide resin.

The light emitting element layer EML may be formed on the thin film transistor layer TFTL. The light emitting element layer EML may include light emitting elements LEL and a pixel defining layer 880. The light emitting element layer EML may be disposed on the second passivation layer 862. Each of the light emitting elements LEL may include a pixel electrode 871, a light emitting layer 872, and a common electrode 873.

The pixel electrode 871 of each of the light emitting elements LEL may be formed on the second passivation layer 862. The pixel electrode 871 of each of the light emitting elements LEL may be connected to the anode connection electrode ANDE through the second anode contact hole CNT_A2 that passes through the second passivation layer 862.

The pixel electrode 871 of the light emitting element LEL may have, but is not limited to, a single layer structure including a material such as molybdenum (Mo), titanium (Ti), copper (Cu), and aluminum (Al), or a stacked layer structure, for example, a multi-layer structure including a material such as indium-tin-oxide (ITO), indium-zinc-oxide (IZO), zinc oxide (ZnO), indium oxide (In$_2$O$_3$), ITO/Mg, ITO/MgF, ITO/Ag and ITO/Ag/ITO, which include silver (Ag), magnesium (Mg), aluminum (Al), platinum (Pt), lead (Pb), gold (Au), or nickel (Ni).

The pixel defining layer 880 may be formed on the second passivation layer 862 to define a light emitting area of subpixels. The light emitting area may be an area in which the pixel electrode 871, the light emitting layer 872 and the common electrode 873 of the light emitting element are sequentially stacked such that holes from the pixel electrode 871 and electrons from the common electrode 873 are recombined in the light emitting layer 872 to emit light.

The pixel defining layer 880 may be formed to cover an edge of the pixel electrode 871 of each of the light emitting elements LEL. The pixel defining layer 880 may be an organic layer including a material such as an acrylic resin, an epoxy resin, a phenolic resin, a polyamide resin, and a polyimide resin.

The light emitting layer 872 may be formed on the pixel electrode 871 of each of the light emitting elements LEL. The light emitting layer 872 may include an organic material to emit light of a color. For example, the light emitting layer 872 may include a hole transporting layer, an organic material layer, and an electron transporting layer.

The common electrode 873 may be disposed on the light emitting layer 872 and the pixel defining layer 880. The common electrode 873 may be formed to cover the light emitting layer 872. The common electrode 873 may be disposed over the entire subpixels. The common electrode 873 may include a conductive material having a low work function, for example, Li, Ca, LiF/Ca, LiF/Al, Al, Mg, Ag, Pt, Pd, Ni, Au Nd, Ir, Cr, BaF, Ba or their compound or mixture (e.g., mixture of Ag and Mg, etc.). In another embodiment, the common electrode 873 may include a transparent metal oxide, for example, indium-tin-oxide (ITO), indium-zinc-oxide (IZO), zinc oxide (ZnO), and the like.

The encapsulation layer TFE may be formed on the light emitting element layer. The encapsulation layer TFE may include at least one inorganic layer to prevent oxygen or moisture from being permeated into the light emitting element layer. The encapsulation layer TFE may include at least one organic layer to protect the light emitting element layer from particles such as dust.

The light emitting element LEL of the first subpixel may overlap the island patterns ISL1, ISL2*a*, and ISL3 in the third direction Z. For example, the light emitting element LEL may overlap the first island pattern ISL1, the second island pattern ISL2*a*, and the third island pattern ISL3.

As a display device 1_1 according to the embodiment includes a valley VAL from which the third insulating layer 830, the fourth insulating layer 840, and the fifth insulating layer 850 are removed to expose the upper surface of the second gate conductive layer 300, and island patterns ISL1, ISL2*a* and ISL3, which are partitioned by the valley VAL, the first semiconductor layer 100, the first gate conductive layer 200, and the second gate conductive layer 300 may be prevented from being discontinuously disposed. Since the first semiconductor layer 100, the first gate conductive layer 200, and the second gate conductive layer 300 are continuously disposed without being disconnected, a separate connection electrode for electrically connecting discontinuous electrodes may be omitted. Therefore, an area of a pixel driver disposed in the subpixel may be ensured.

A display device 1_2 according to another embodiment will be described with reference to FIGS. 13 and 14. FIG. 13 is a schematic cross-sectional view taken along line A-A' of FIGS. 5, 6 and 10 according to another embodiment of the disclosure. FIG. 14 is a schematic cross-sectional view taken along line B-B' and line C-C' of FIGS. 5, 6 and 10 according to another embodiment of the disclosure.

A display device 1_2 according to the embodiment is different from the display device 1_1 according to the previous embodiment in that it includes a valley VAL from which the fifth insulating layer 850 is removed to expose the upper surface of the third gate conductive layer 500, and island patterns ISL1, ISL2*a*, and ISL3 partitioned by the valley VAL. The embodiment is the same as the previous embodiment in that the valley VAL is formed in an area that does not overlap the first data conductive layer 600 and does not overlap the second semiconductor layer 400.

In detail, the first semiconductor layer 100, the first insulating layer 810, the first gate conductive layer 200, the second insulating layer 820, the second gate conductive layer 300, the third insulating layer 830, the fourth insulating layer 840, and the third gate conductive layer 500 may be disposed in the valley VAL.

The third gate conductive layer 500 disposed in the valley VAL may be exposed as the fifth insulating layer 850 is etched. The first passivation layer 861 disposed in the valley VAL may be directly in contact with the upper surface of the third gate conductive layer 500. For example, the valley VAL may not overlap the fifth insulating layer 850. For example, as the fifth insulating layer 850 is etched from the valley VAL*a*, the upper surface and the side of the third gate conductive layer 500 may be exposed.

In case that the third gate conductive layer 500 is not disposed in the valley VAL, the fifth insulating layer 850 may be etched to expose the fourth insulating layer 840. For example, valleys VAL*a* VAL*b*, VAL*c*, and VAL*d* may include a fourth insulating layer 840) that is exposed. The exposed upper surface of the fourth insulating layer 840 may be directly in contact with the first passivation layer 861. A thickness of the fourth insulating layer 840) disposed on the valleys VAL*b*, VAL*c*, and VAL*d* may be thinner than that of the fourth insulating layer 840 disposed on the valley VAL*a* or the island patterns ISL1, ISL2*a* and ISL3, but is not limited thereto.

According to the embodiment, as a portion of the insulating layer 850, which does not overlap the first data conductive layer 600, is removed, an area where the inorganic insulating layer is disposed may be minimized. The insulating layer 850 may include a discontinuous portion in at least a portion thereof.

The first passivation layer 861 may be directly in contact with the upper surfaces of the third gate conductive layer

500 and the fourth insulating layer 840, which are exposed in the valley VAL. The first passivation layer 861 may be directly in contact with the sides of the fourth insulating layer 840 and the fifth insulating layer 850, which are exposed in the valley VAL.

In the display device 1_2 according to the embodiment, the semiconductor layers 100 and 400 and the first to third gate conductive layers 200, 300 and 500 may be protected from external impact, and stress applied to the insulating layers 830, 840 and 850 may be reduced. For example, the valley VAL may protect the island patterns ISL1, ISL2a and ISL3 from external impact.

As the valley VAL from which the fifth insulating layer 850 is removed to expose the upper surface of the third gate conductive layer 500 is formed, the first semiconductor layer 100, the first gate conductive layer 200, the second gate conductive layer 300, the second semiconductor layer 400 and the third gate conductive layer 500 may be prevented from being discontinuously disposed. Since the first semiconductor layer 100, the first gate conductive layer 200, the second gate conductive layer 300, the second semiconductor layer 400, and the third gate conductive layer 500 may be continuously disposed without being disconnected, a separate connection electrode for electrically connecting the discontinuous electrodes may be omitted. Therefore, the area of the pixel driver disposed in the subpixel may be ensured.

FIGS. 15 to 20 are schematic cross-sectional views illustrating a method of manufacturing a display device according to one embodiment of the disclosure.

Figure 15:
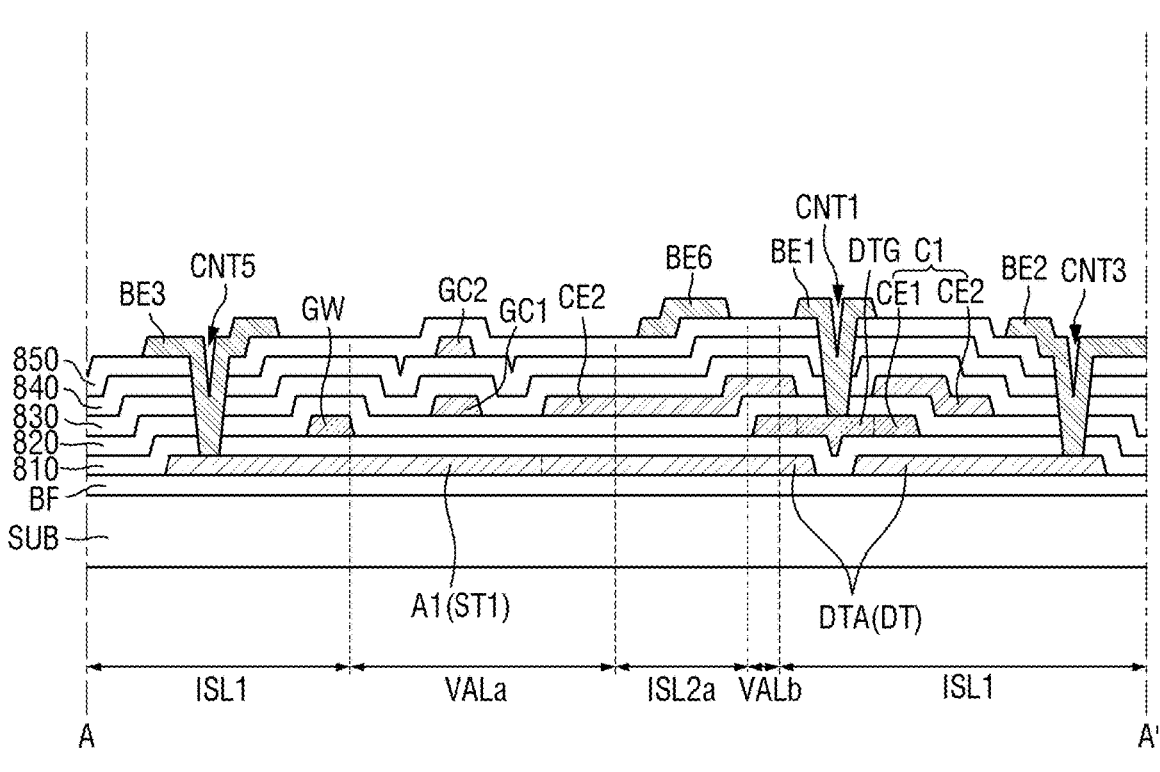
FIGS. 15 to 20 are schematic cross-sectional views illustrating a method of manufacturing a display device according to one embodiment of the disclosure.

Referring to FIG. 15, a buffer layer BF, a first semiconductor layer 100, a first insulating layer 810, a first gate conductive layer 200, a second insulating layer 820, a second gate conductive layer 300, a third insulating layer 830, a fourth semiconductor layer 400, a fourth insulating layer 840, and a third gate conductive layer 500 may be sequentially formed on a substrate SUB.

The buffer layer BF may be disposed over the entire area of the substrate SUB. The first semiconductor layer 100, the first insulating layer 810, the first gate conductive layer 200, the second insulating layer 820, the second gate conductive layer 300, the third insulating layer 830, and the third gate conductive layer 400 may be patterned by disposing material layers, which are capable of forming each layer over the entire area of the buffer layer BF (or substrate SUB), and etching the same. An etching mask may be used in the process of etching each layer. Before the respective gate conductive layers 200, 300, and 500 and the first data conductive layer 600 are patterned, a process of forming a contact hole may be carried out.

For example, a first conductive material layer including the same material as that of the first gate conductive layer 200 may be formed on the buffer layer BF. A photo-resist pattern may be formed on the first conductive material layer, and the first conductive material layer may be patterned using the photo-resist pattern as an etch stop layer to form the first gate conductive layer 200. In detail, a photosensitive organic material may be coated on the first conductive material layer and may be exposed and developed to form the photo-resist pattern on the first conductive material layer, and a portion of the first conductive material layer, which is not covered by the photo-resist pattern, may be etched by a wet etch process. The first gate conductive layer 200 may be a residue remaining after the first conductive material layer is etched.

As the above process is repeated, the first semiconductor layer 100, the first gate conductive layer 200, the second gate conductive layer 300, the fourth semiconductor layer 400, the third gate conductive layer 500, and the first data conductive layer 600 may be patterned as shown in FIG. 5.

Figure 16:
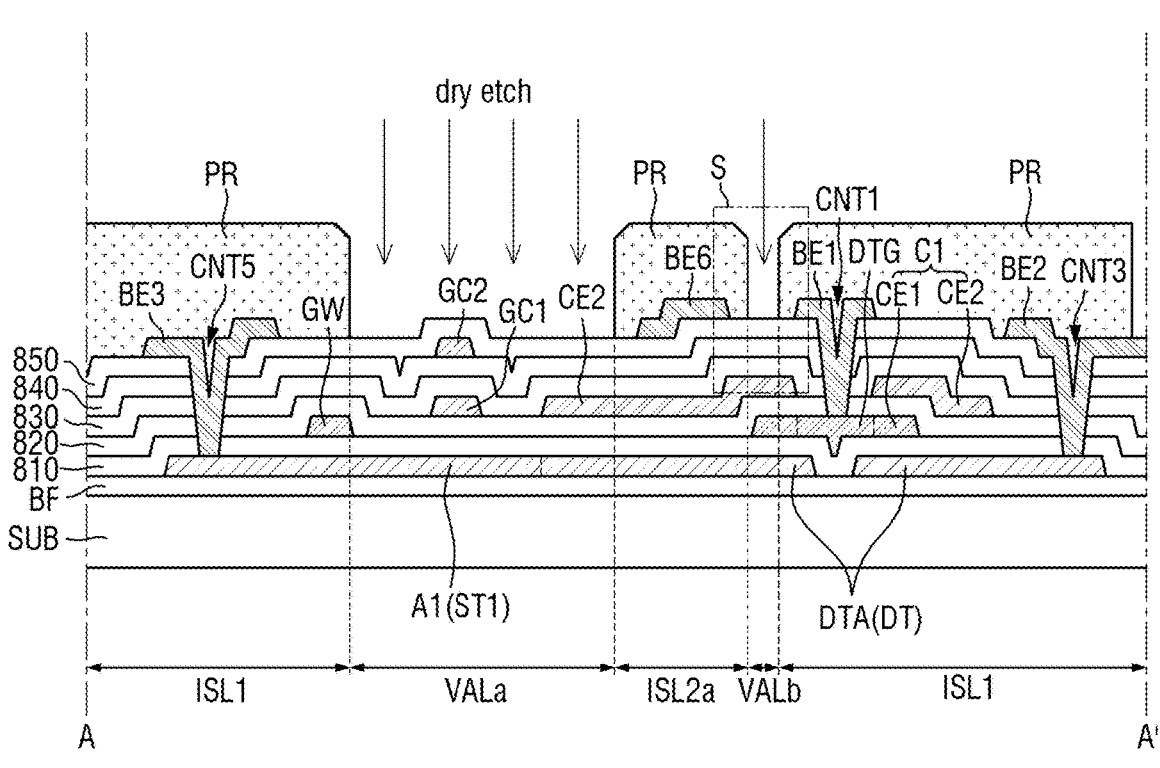
Figure 17:
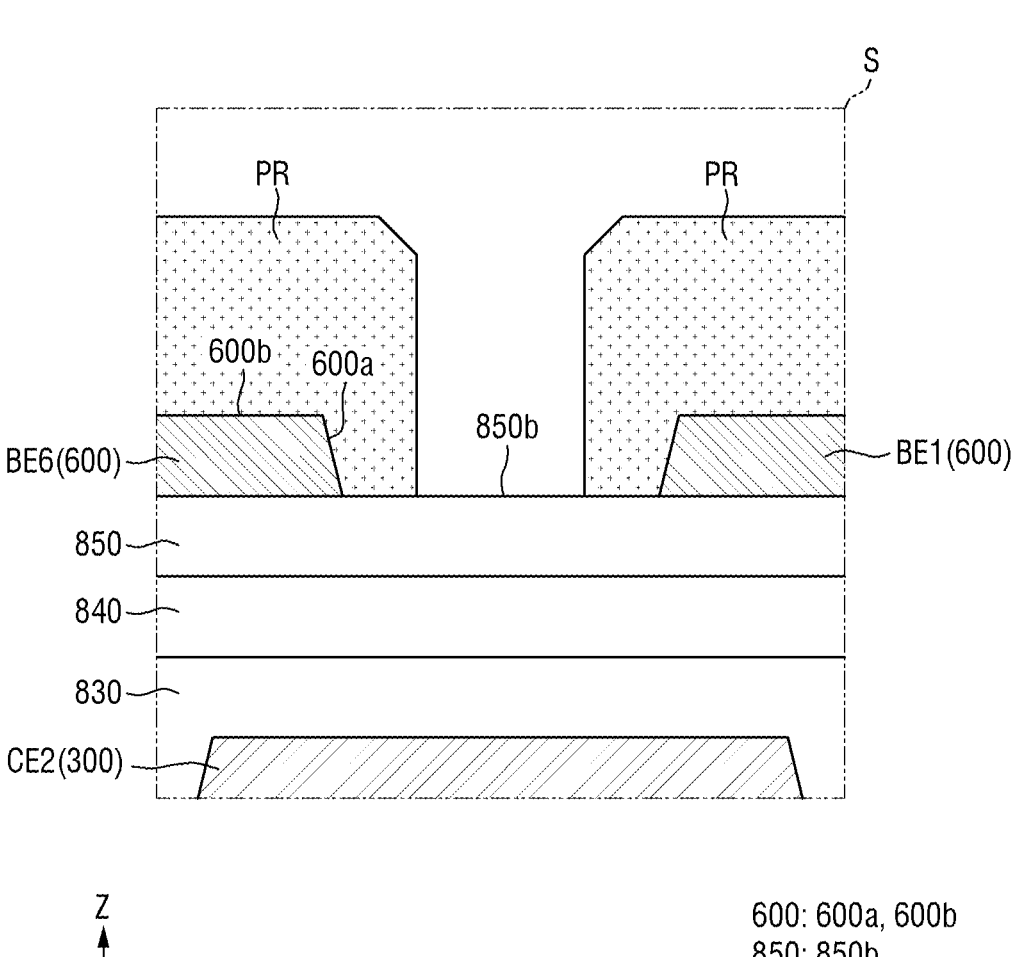

Referring to FIGS. 16 and 17, a photo-resist pattern PR may be disposed in an area overlapping the first data conductive layer 600. A photo-resist pattern material layer may be coated on the fifth insulating layer 850 to cover the first data conductive layer 600, and may be exposed and developed to form the photo-resist pattern PR.

FIG. 17 is an enlarged view of area S of FIG. 16. Referring to FIG. 17, the photo-resist pattern PR may be disposed on an upper surface 600b and a side 600a of the first data conductive layer 600, and may be disposed on a portion of an upper surface 850b of the fifth insulating layer 850 positioned outside of one side of the first data conductive layer 600.

The planar position of the photo-resist pattern PR may be substantially the same as positions of the island patterns ISL1, ISL2a, ISL2b and ISL3 of FIG. 7.

Subsequently, referring to FIGS. 18 and 19, the fifth insulating layer 850, the fourth insulating layer 840, and the third insulating layer 830 may be etched using the photo-resist pattern as an etching mask.

For example, in case that the photo-resist pattern PR is used as an etching mask, a dry etch process may be performed for the area that is not covered by the photo-resist pattern PR. The area of the insulating layers 830, 840 and 850 where the photo-resist pattern is not disposed may be etched. Therefore, a valley VAL in which the first semiconductor layer 100, the first insulating layer 810, the first gate conductive layer 200, and the second insulating layer 820 are disposed may be formed.

Figure 18:
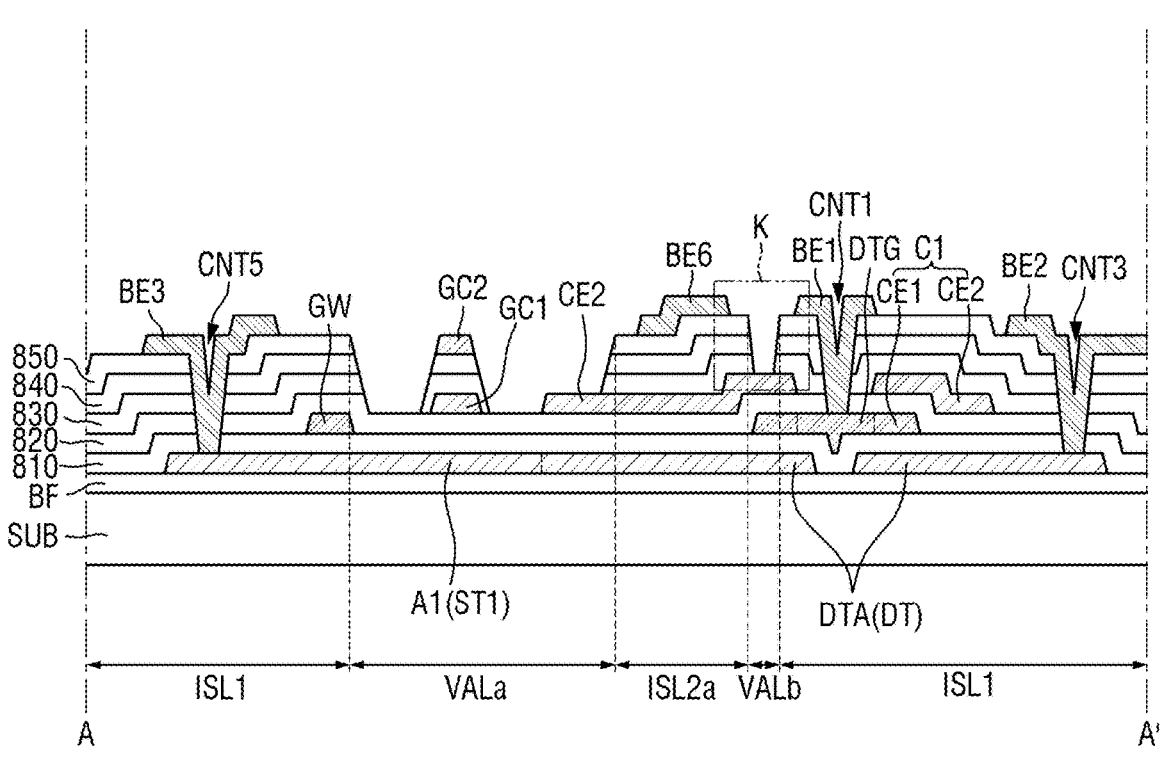
Figure 19:
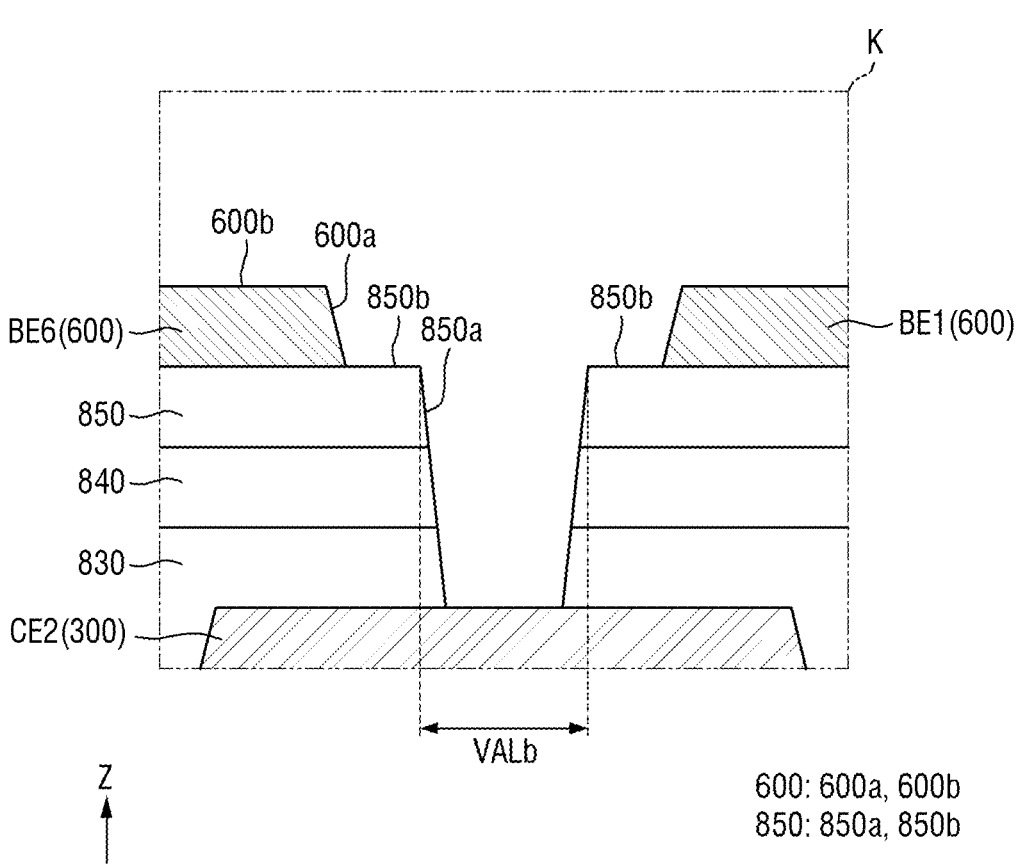

FIG. 19 is an enlarged view of area K of FIG. 18. Referring to FIG. 19, a side 850a of the fifth insulating layer 850, a side of the fourth insulating layer 840, a side of the third insulating layer 830, and an upper surface of the second gate conductive layer 300 may be exposed by a dry etching process. Since a portion of the upper surface 850b of the fifth insulating layer 850 is covered by the photo-resist pattern PR, a portion of the upper surface 850b of the fifth insulating layer 850 may not be etched. The side 600a of the first data conductive layer 600 and the side 850b of the fifth insulating layer 850 may be spaced apart from each other.

The insulating layers 820, 830 and 840 overlapping the gate conductive layers 300 and 500 and disposed below the gate conductive layers 300 and 500 may not be etched. For example, the fourth insulating layer 840 and the third insulating layer 830, which overlap the second scan control line GC2 of the third gate conductive layer 500 and disposed below the second scan control line GC2, may not be etched.

After the fifth insulating layer 850, the fourth insulating layer 840, and the third insulating layer 830 are etched, the photo-resist pattern may be removed by a strip or ashing process.

Figure 20:
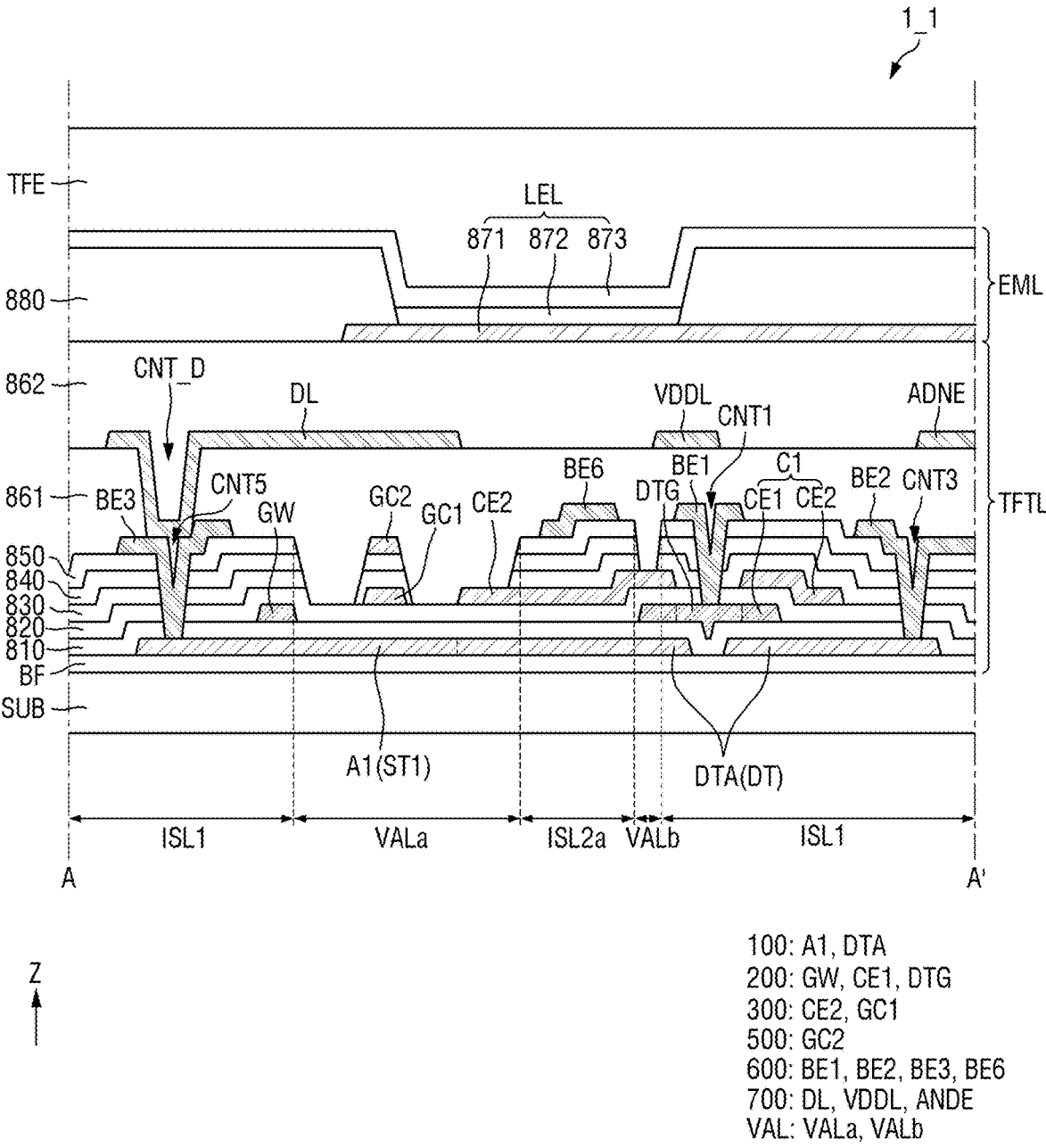

Referring to FIG. 20, a first passivation layer 861 may be formed on the first data conductive layer 600. The first passivation layer 861 may be disposed over the entire area of the substrate SUB. The first passivation layer 861 may fill the etched portions of the insulating layers 850, 840 and 830.

For example, the first passivation layer 861 may fill the portions of the fifth insulating layer 850, the fourth insulating layer 840, and the third insulating layer 830, which are etched from the valley VALa. The first passivation layer 861 may be directly in contact with the second gate conductive layer 300 and the second insulating layer 820, which are exposed in the valley VALa.

Hereinafter, another embodiment of the disclosure will be described. The description of the same elements as those described as above will be omitted or simplified, and a difference from the above elements will be described.

Figure 21:
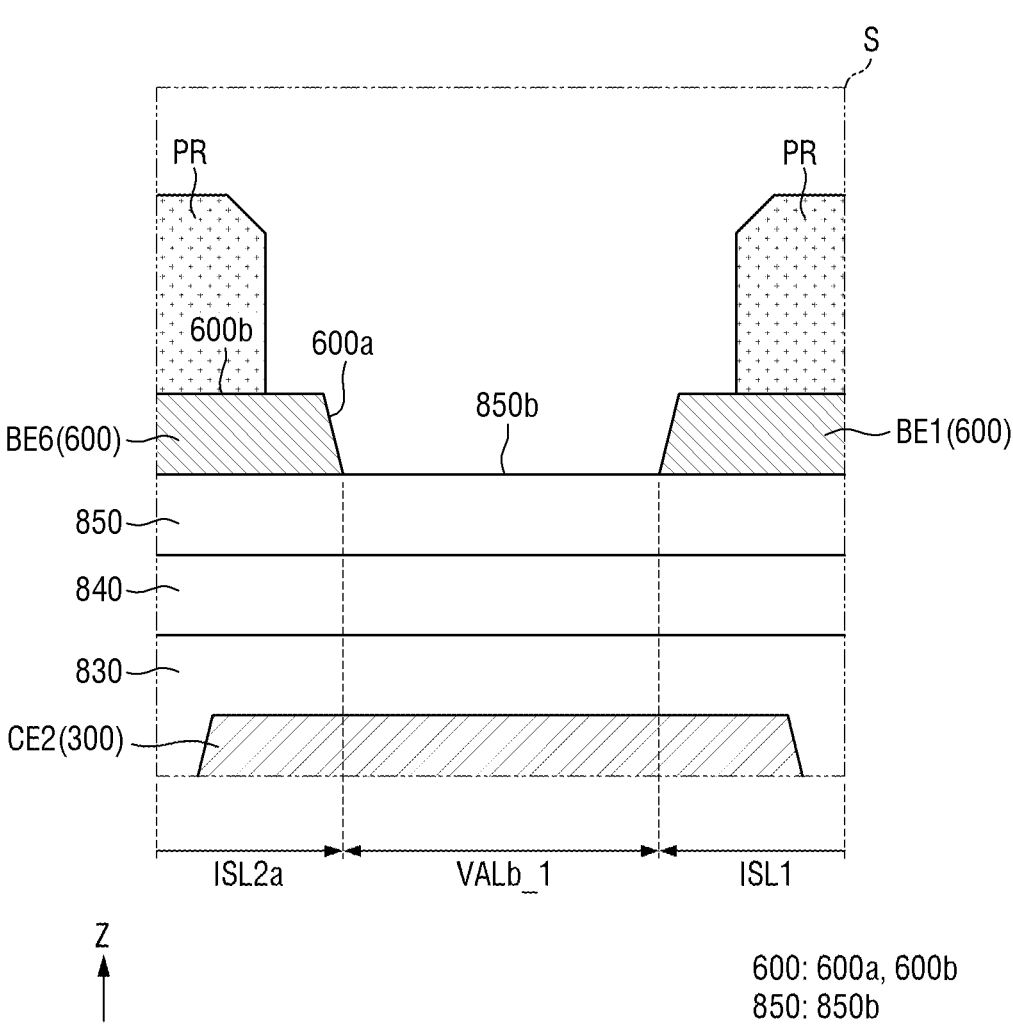
FIGS. 21 to 23 are schematic cross-sectional views illustrating a method of manufacturing a display device according to another embodiment of the disclosure.
Figure 22:
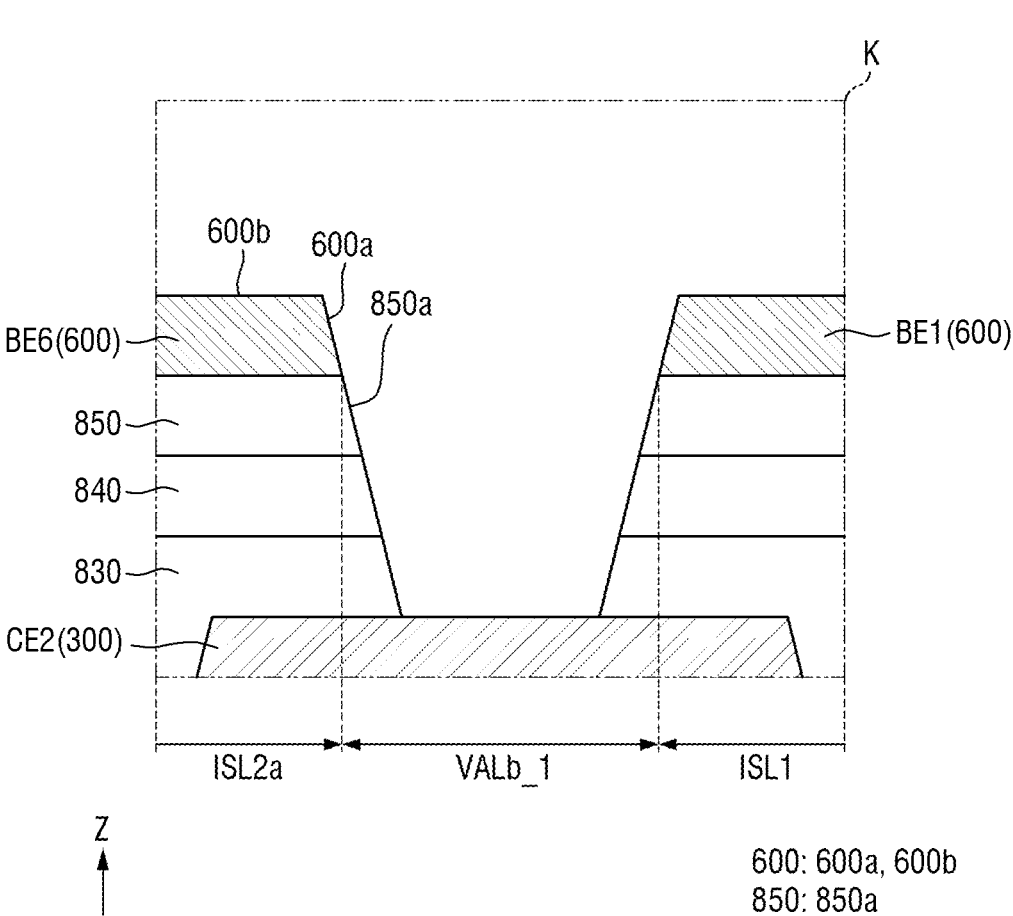
Figure 23:
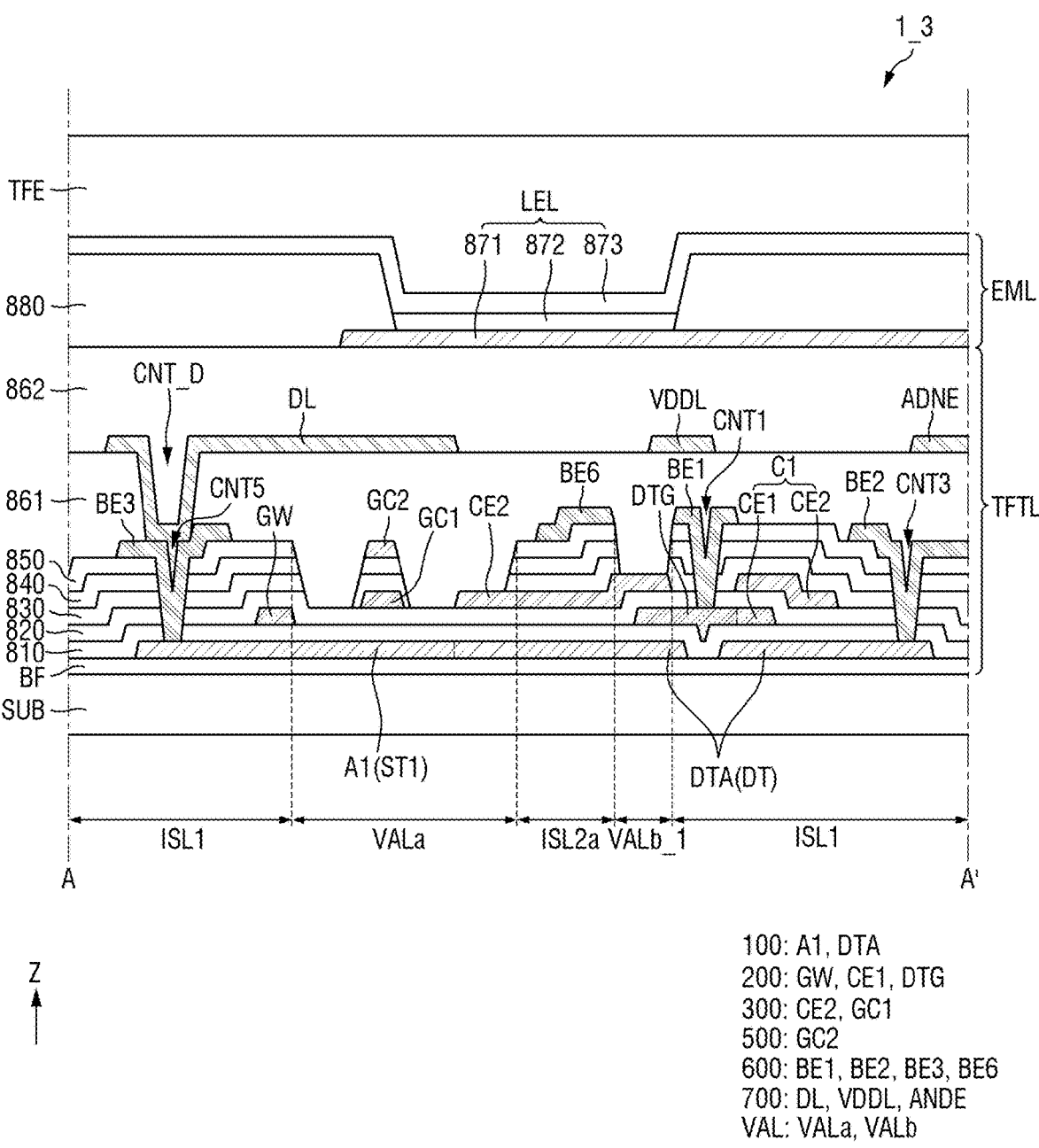

FIGS. 21 to 23 are schematic cross-sectional views illustrating a method of manufacturing a display device according to another embodiment of the disclosure. FIG. 21 is an enlarged view of area S of FIG. 16, and FIG. 22 is an enlarged view of the K of FIG. 18.

In a display device 1_3 according to the embodiment, the gate conductive layers 200, 300 and 500 may serve as etching masks in a process of etching the insulating layers 850, 840 and 830.

The above process may be applied in case that an interval of the fifth insulating layer 850 positioned between the first data conductive layers 600 is narrow, but is not limited thereto. For example, referring to FIG. 21, the first data conductive layer 600 may serve as an etching mask for etching the insulating layers 850, 840 and 830 in case that the photo-resist pattern PR is not formed on the upper surface 850a of the fifth insulating layer 850 due to a narrow interval between the first connection electrode BE1 disposed in the first island pattern ISL1 near the valley VALb_1 and the sixth connection electrode BE6 disposed in the second a island pattern ISL2a.

Subsequently, referring to FIG. 22, the fifth insulating layer 850, the fourth insulating layer 840 and the third insulating layer 830 may be etched using the first data conductive layer 600 as an etching mask. For example, a dry etching process may be performed for the area that is not covered by the first data conductive layer 600.

Through the above process, the side 850a of the fifth insulating layer 850, the side of the fourth insulating layer 840, the side of the third insulating layer 830, and the upper surface of the second gate conductive layer 300 may be exposed. Since the insulating layer of the area in which the first data conductive layer 600 is not disposed may be etched, the first semiconductor layer 100, the first insulating layer 810, the first gate conductive layer 200 and the second insulating layer 820 may be disposed in the valley VAL.

The side 850a of the fifth insulating layer 850, the side of the fourth insulating layer 840, and the side of the third insulating layer 830 may be inclined at substantially the same angle as that of the side 600a of the first data conductive layer 600. For example, the side 600a of the first data conductive layer 600, the side 850b of the fifth insulating layer 850, the side of the fourth insulating layer 840, and the side of the third insulating layer 830 may be connected to each other.

Referring to FIG. 23, a first passivation layer 861 may be formed on the first data conductive layer 600. The first passivation layer 861 may be disposed over the entire area of the substrate SUB. The first passivation layer 861 may fill the etched portions of the insulating layers 850, 840 and 830.

Figure 24:
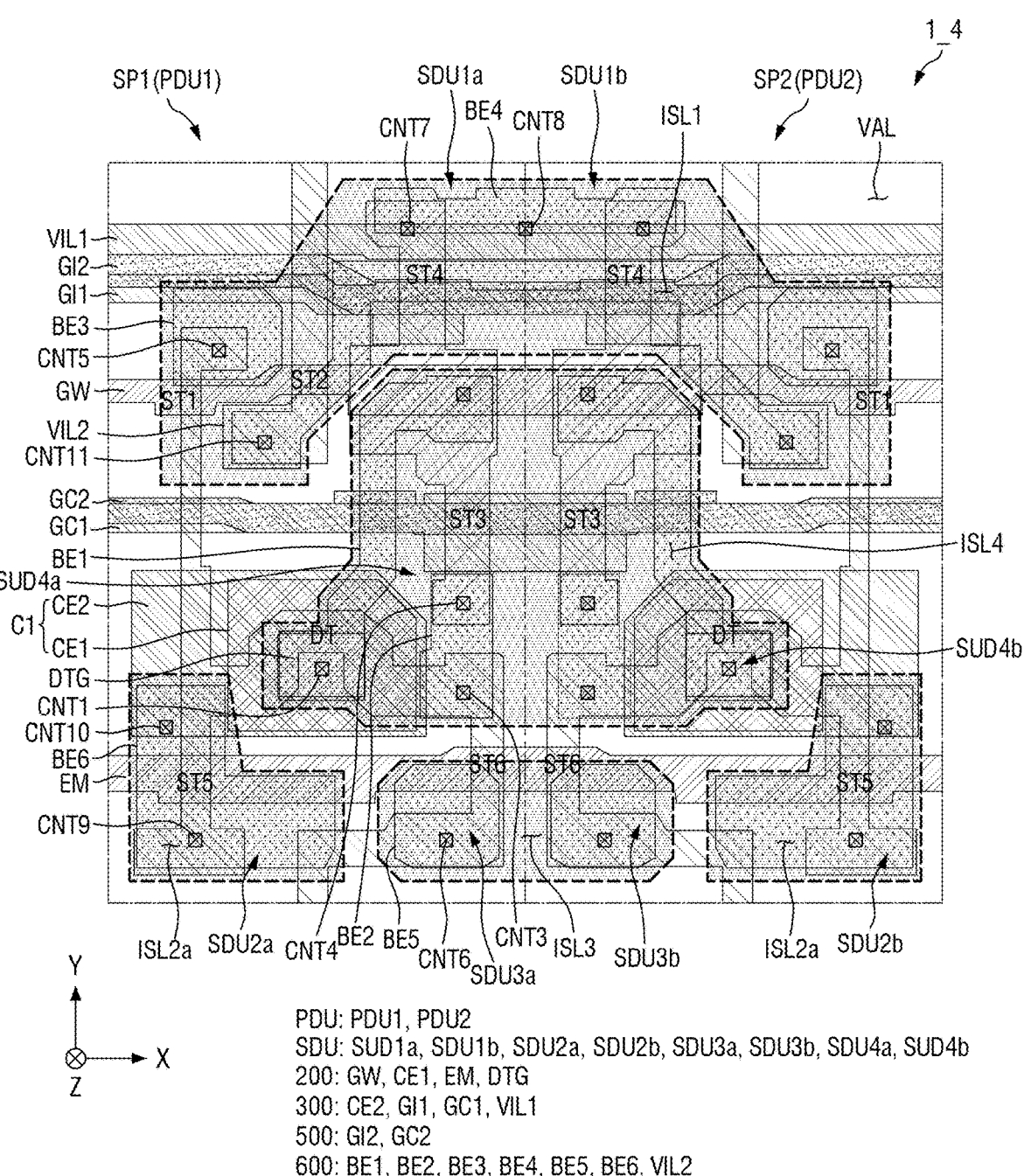
FIG. 24 is a layout view illustrating island patterns and a valley according to another embodiment of the disclosure.

FIG. 24 is a layout view illustrating island patterns and a valley according to another embodiment of the disclosure.

Referring to FIG. 24, a display device 1_4 according to the embodiment may include a first island pattern ISL1, second island patterns ISL2a and ISL2b, a third island pattern ISL3, and a fourth island pattern ISL4. The island patterns ISL1, ISL2a, ISL2b, ISL3 and ISL4 may be partitioned by a valley VAL. The island patterns ISL1, ISL2a, ISL2b, ISL3 and ISL4 may include first to sixth connection electrodes BE1 to BE6 and a second initialization voltage line VIL2 of the first data conductive layer 600, respectively.

The island patterns ISL1, ISL2a, ISL2b, ISL3 and ISL4 may be disposed in the first pixel driving part PDU1 and/or the second pixel driving part PDU2 in the same manner as FIG. 7.

The island patterns ISL1, ISL2a, ISL2b, ISL3 and ISL4 may include a first island pattern ISL1, two second island patterns ISL2a and ISL2b, a third island pattern ISL3, and a fourth island pattern ISL4. The first island pattern ISL1, the third island pattern ISL3 and the fourth island pattern ISL4 may be formed over a portion of the first pixel driving part PDU1 and a portion of the second pixel driving part PDU2. The second a island pattern ISL2a may be disposed in a portion of the first pixel driving part PDU1, and the second b island pattern ISL2b may be disposed in a portion of the second pixel driving part PDU2.

The pixel driving part PDU may include first subpixel driving parts SDU1a and SDU1b including a first transistor ST1, a second transistor ST2 and a fourth transistor ST4, second subpixel driving parts SDU2a and SDU2b including a fifth transistor ST5, third subpixel driving parts SDU3a and SDU3b including a sixth transistor ST6, and fourth subpixel driving parts SDU4a and SDU4b including a driving transistor DT and a third transistor ST3.

The first island pattern ISL1 may be disposed over the first a subpixel driving part SDU1a of the first pixel driving part PDU1 and the first b subpixel driving part SDU1b of the second pixel driving part PDU2. The second a island pattern ISL2a may be disposed in the second subpixel driving part SDU2a of the first pixel driving part PDU1, and the second b island pattern ISL2b may be disposed in the second subpixel driving part SDU2b of the second pixel driving part PDU2. The third island pattern ISL3 may be disposed over the third a subpixel driving part SDU3a of the first pixel driving part PDU1 and the third b subpixel driving part SDU3b of the second pixel driving part PDU2. The fourth island pattern ISL4 may be disposed over the fourth subpixel driving part SDU4a of the first pixel driving part PDU1 and the fourth subpixel driving part SDU4b of the second pixel driving part PDU2.

Therefore, an area of each of the island patterns ISL1, ISL2a, ISL2b, ISL3, and ISL4 may be smaller than that of the pixel driving part PDU. The area of each of the island patterns ISL1, ISL2a, ISL2b, ISL3, and ISL4 may correspond to that of each subpixel driving part SDU. The island patterns ISL1, ISL2a, ISL2b, ISL3, and ISL4 may be different from one another in an area and a planar shape.

The display device 1_4 according to the embodiment may suppress or prevent transfer of external impact by an inorganic insulating layer as the valley VAL is formed.

The display device 1_4 according to the embodiment may include multiple island patterns ISL1, ISL2a, ISL2b, ISL3, and ISL4 disposed in the subpixel driving parts SDU, each of which has an area smaller than that of the pixel driving part PDU. Therefore, as a separate area for forming the valley VAL in the pixel driving part PDU is minimized, resolution of the display device 1_4 may be prevented from being reduced.

In the display device 1_4 according to the embodiment, since the island patterns ISL1, ISL2a, ISL2b, ISL3, and ISL4 have a polygonal shape in which an inner angle IA and/or an outer angle OA is 90° or more, stress that may occur in the valley VAL may be minimized.

Figure 25:
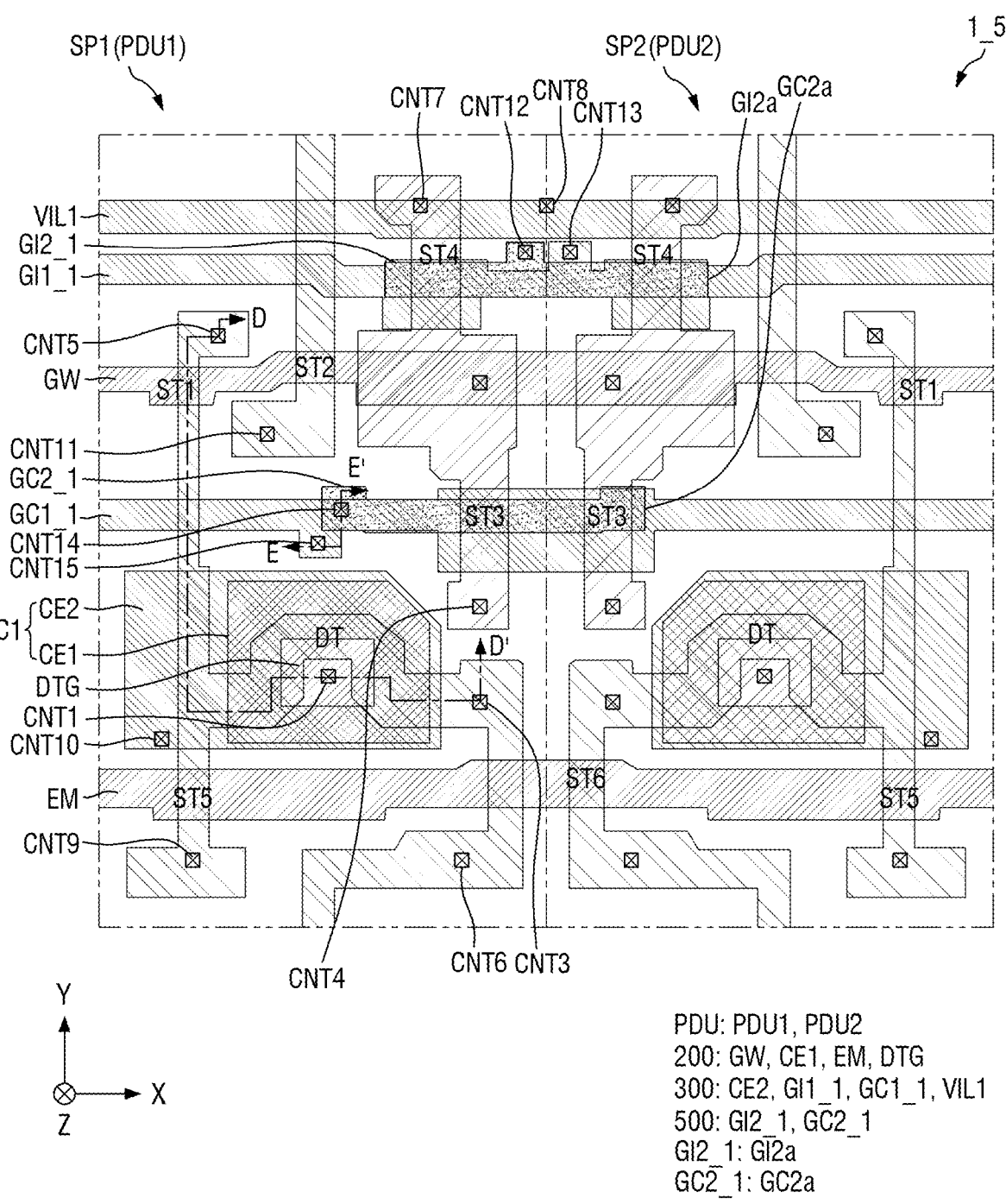
FIGS. 25 and 26 are layout views illustrating subpixels according to another embodiment of the disclosure.
Figure 26:
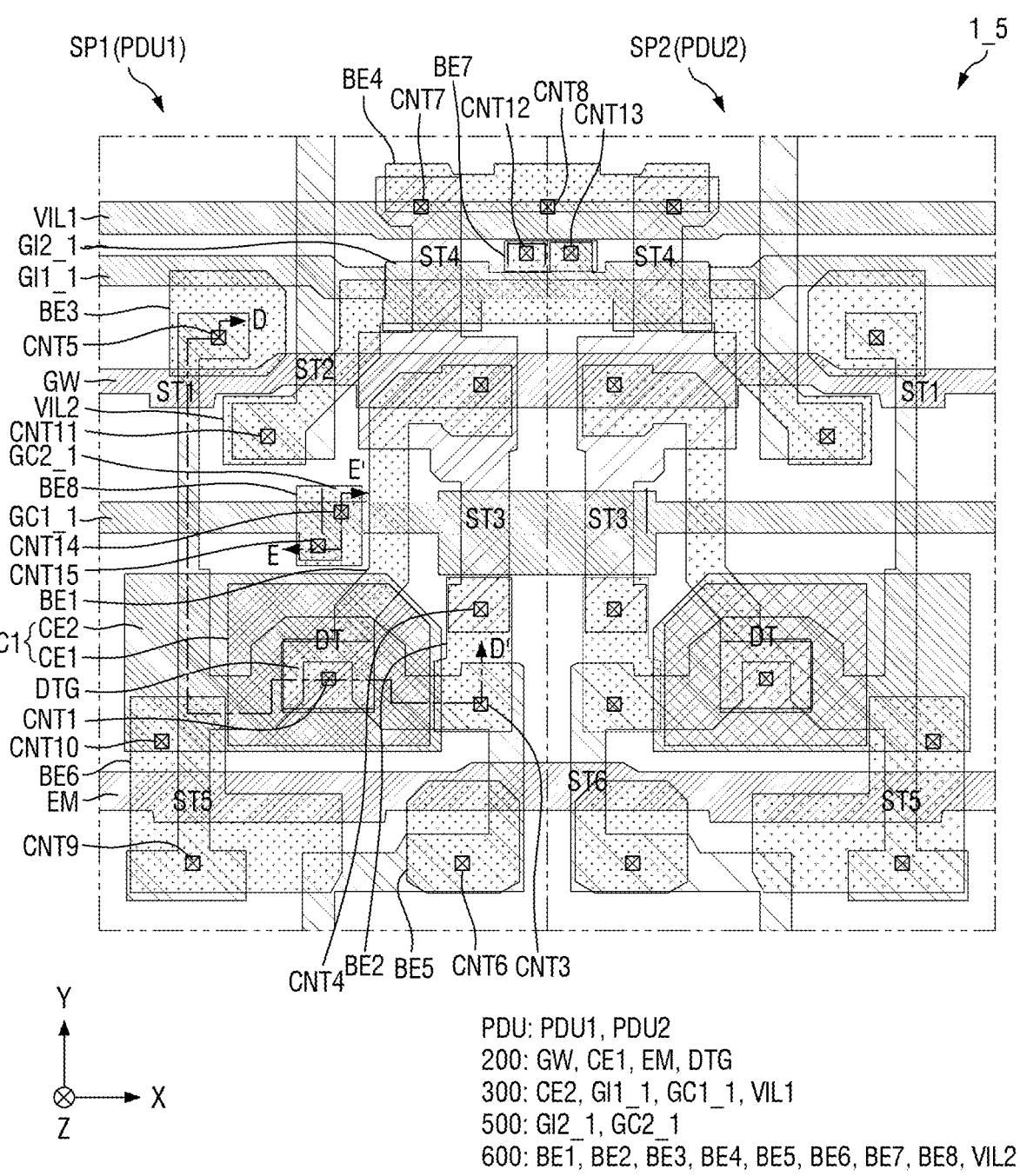

FIGS. 25 and 26 are layout views illustrating subpixels according to another embodiment of the disclosure. Referring to FIG. 25, the first semiconductor layer 100, the first gate conductive layer 200, the second gate conductive layer 300, the second semiconductor layer 400, and the third gate conductive layer 500 may be sequentially stacked along the third direction Z. Referring to FIG. 26, the first data conductive layer 600 may be further stacked in FIG. 25.

Referring to FIG. 25, a display device 1_5 according to the embodiment may include a first scan initialization line GI1_1 and a second scan initialization line GI2_1, which overlap each other, and may include a first scan control line GC1_1 and a second scan control line GC2_1, which overlap each other. Unlike the previous embodiments, the second scan initialization line GI2_1 disposed in the third gate conductive layer 500 may include a disconnection portion GI2a disposed in the first pixel driving part PDU1 and the second pixel driving part PDU2, and the second scan control line GC2_1 may include a disconnection portion GC2a disposed in the first pixel driving part PDU1 and the second pixel driving part PDU2. The disconnection portion GI2a of the second scan initialization line GI2_1 and the disconnection portion GC2a of the second scan control line GC2_1 may be defined as portions disconnected without being extended in the first direction X over the pixel driving parts PDU, and the disconnection portions GI2a and GC2a may be both ends of the second scan initialization line GI2_1 and the second scan control line GC2_1, respectively.

The embodiment is the same as the previous embodiments in that the first scan initialization line GI1_1 and the first scan control line GC1_1, which are disposed on the second gate conductive layer 300, may be extended over the first pixel driving part PDU1 and the second pixel driving part PDU2 along the first direction X. The first scan initialization line GI1_1 and the first scan control line GC1_1 may be extended to the pixel driving parts PDU repeatedly arranged on one side of the first pixel driving part PDU1 and the second pixel driving part PDU2. For example, referring to FIG. 2, the first scan initialization line GI1_1 and the first scan control line GC1_1 may be connected to the scan driving circuit ('40' of FIG. 2) disposed in the non-display area NDA of the display panel 10 so that a scan initialization signal and a scan control signal may be applied thereto.

Unlike this embodiment, since the second scan initialization line GI2_1 and the second scan control line GC2_1 include the disconnection portions GI2a and GC2a disposed in the first pixel driving part PDU1 and the second pixel driving part PDU2, the same scan initialization signal and the same scan control signal need to be applied to the second scan initialization line GI2_1 and the second scan control line GC2_1 to serve as upper gate electrodes of the third transistor ST3 and the fourth transistor ST4.

Referring to FIG. 26, the display device 1_5 according to the embodiment may further include multiple connection electrodes disposed on the first data conductive layer 600 to apply the scan initialization signal and the scan control signal to the second scan initialization line GI2_1 and the second scan control line GC2_1, respectively. For example, the display device 1_5 may further include a seventh connection electrode BE7 connecting the first scan initialization line GI1_1 with the second scan initialization line GI2_1 and an eighth connection electrode BE8 connecting the first scan control line GC1_1 with the second scan control line GC2_1. The seventh connection electrode BE7 and the eighth connection electrode BE8 may be scan connection electrodes connecting different scan lines.

The seventh connection electrode BE7 may be connected to the second scan initialization line GI2_1 through a twelfth contact hole CNT12, and may be connected to the first scan initialization line GI1_1 through a thirteenth contact hole CNT13. The eighth connection electrode BE8 may be connected to the first scan control line GC1_1 through a fourteenth contact hole CNT14, and may be connected to the second scan control line GC2_1 through a fifteenth contact hole CNT15.

In other words, the first scan initialization line GI1_1 and the second scan initialization line GI2_1 may be connected to each other through the seventh connection electrode BE7 so that the same scan initialization signal may be applied thereto. The first scan control line GC1_1 and the second scan control line GC2_1 may be connected to each other through the eighth connection electrode BE8 so that the same scan control signal may be applied thereto.

The display device of the embodiment is the same as that of the previous embodiment in that it includes multiple island patterns disposed in the pixel driving part PDU and a valley partitioning the island patterns, its description of the planar layout will be omitted. For example, the embodiment is the same as that of FIG. 7 in that the first island pattern ISL1 overlaps the first connection electrode BE1, the second connection electrode BE2, the third connection electrode BE3, the fourth connection electrode BE4, and the second initialization voltage line VIL2, and in accordance with the embodiment, the first island pattern ISL1 may be modified to further overlap the seventh connection electrode BE7 and the eighth connection electrode BE8.

Figure 27:
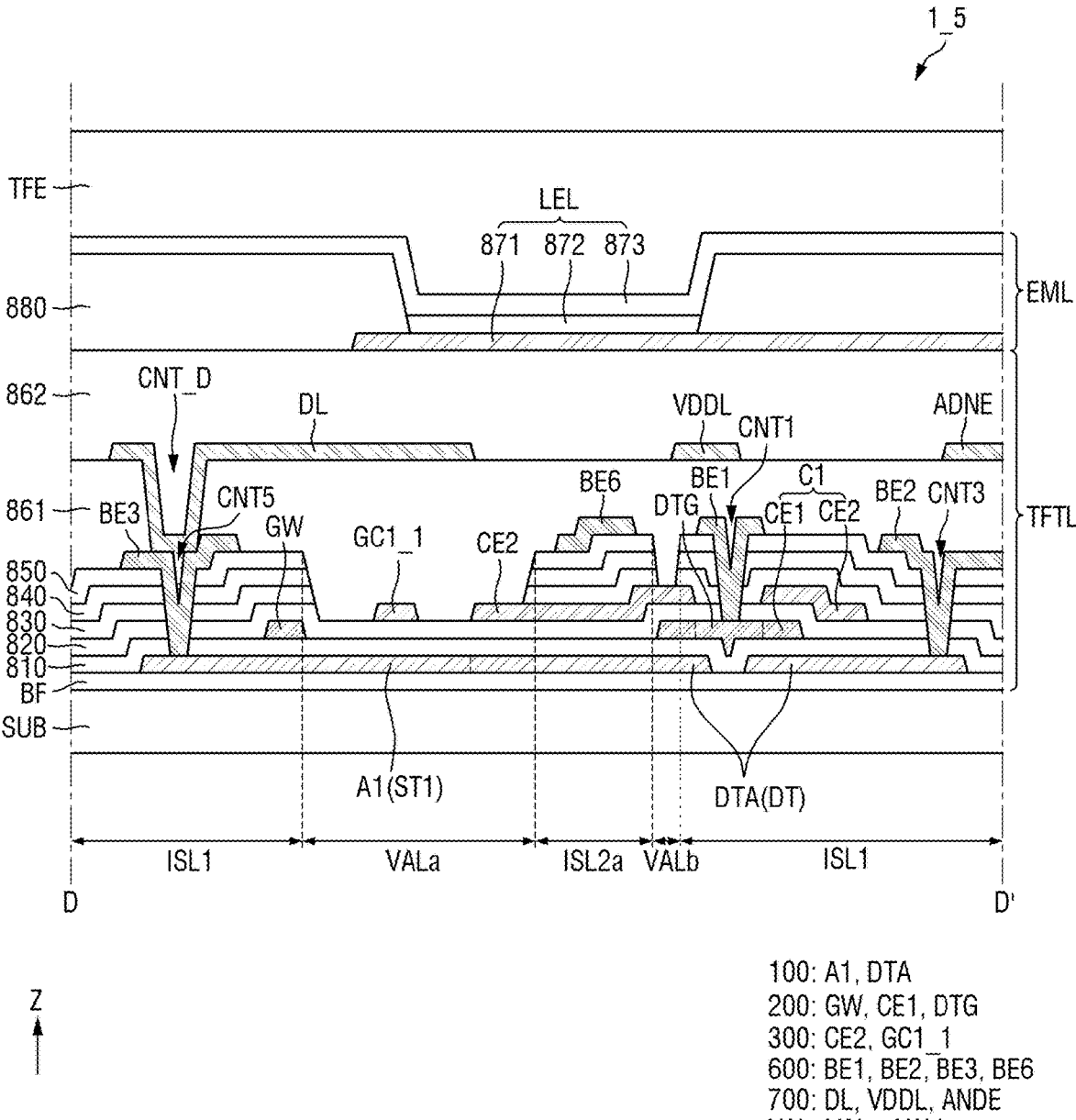
FIG. 27 is a schematic cross-sectional view taken along line D-D' of FIGS. 25 and 26 according to an embodiment of the disclosure.

FIG. 27 is a schematic cross-sectional view taken along line D-D' of FIGS. 25 and 26 according to an embodiment of the disclosure.

Referring to FIG. 27, the display device 1_5 according to the embodiment is different from that of the embodiment of FIGS. 11 and 13 in that it does not include a second scan control line overlapping the first scan control line GC1_1 in the valley VALa.

The upper surface of the first scan control line GC1_1 of the second gate conductive layer 300 may be exposed in the valley VALa from which the insulating layers 830, 840 and 850 are removed. For example, the valley VALa may not overlap the third insulating layer 830, the fourth insulating layer 840, and the fifth insulating layer 850. The first semiconductor layer 100, the first insulating layer 810, the first gate conductive layer 200, the second insulating layer 820, and the second gate conductive layer 300 may be disposed in the valley VALa.

Figure 28:
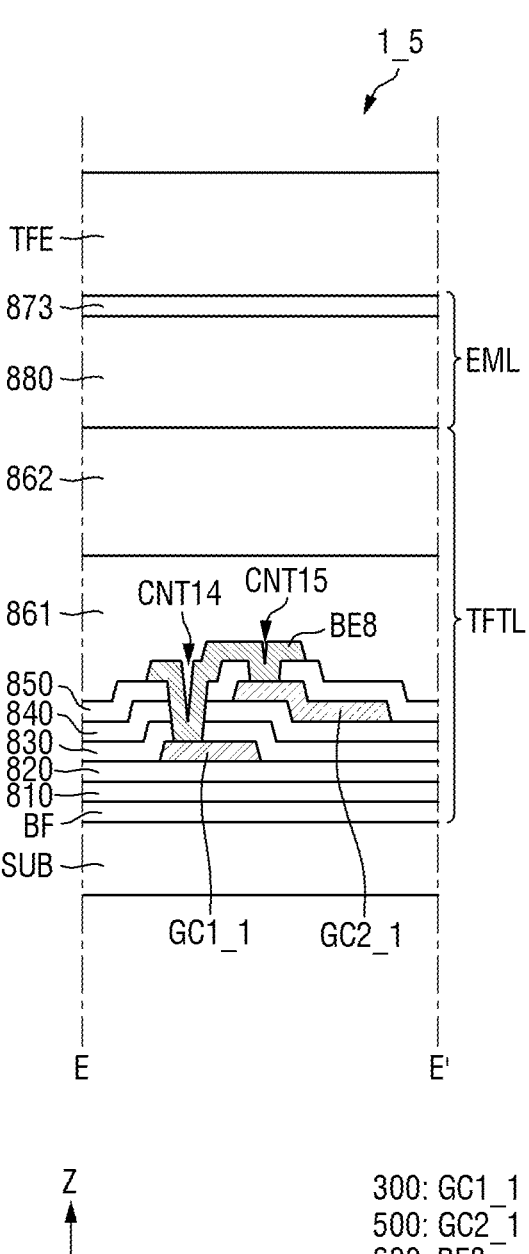
FIG. 28 is a schematic cross-sectional view taken along line E-E' of FIGS. 25 and 26 according to an embodiment of the disclosure.

FIG. 28 is a schematic cross-sectional view taken along line E-E' of FIGS. 25 and 26 according to an embodiment of the disclosure.

The first scan control line GC1_1 and the second scan control line GC2_1, which are connected to each other through the eighth connection electrode BE8, are shown in FIG. 28.

A fourteenth contact hole CNT14 may be a hole that exposes the first scan control line GC1_1 by passing through the fifth insulating layer 850, the fourth insulating layer 840, and the third insulating layer 830. A fifteenth contact hole CNT15 may be a hole that exposes the second scan control line GC2_1 by passing through the fifth insulating layer 850. The eighth connection electrode BE8 may be connected to the first scan control line GC1_1 through the fourteenth contact hole CNT14, and may be connected to the second scan control line GC2_1 through the fifteenth contact hole CNT15.

Although the seventh connection electrode BE7 connected to the first scan initialization line GI1_1 and the second scan initialization line GI2_1 is not shown, the seventh connection electrode BE7 may have a cross-sectional structure similar to that of FIG. 28.

Referring to FIGS. 25 to 28, the display device 1_5 according to the embodiment may include a disconnection portion GI2a of the second scan initialization line GI2_1 and a disconnection portion GC2a of the second scan control line GC2_1, so that the valley VAL may not overlap the third insulating layer 830, the fourth insulating layer 840, and the fifth insulating layer 850. For example, the upper surface of the first scan initialization line GI1_1 disposed in the valley VALa may be prevented from not being exposed. The upper surface of the first scan control line GC1_1 disposed in the valley may be prevented from not being exposed.

Figure 29:
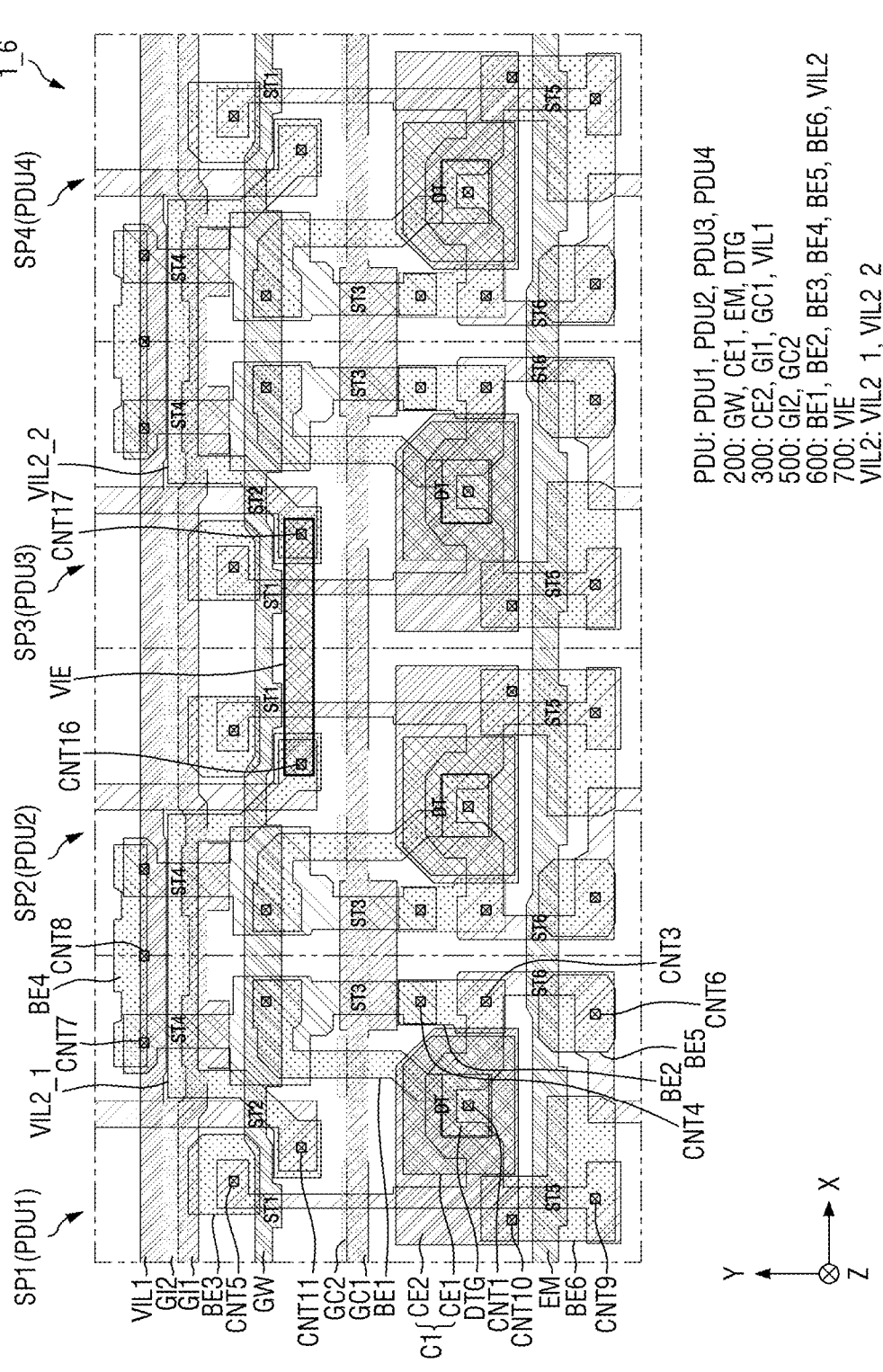
FIG. 29 is a layout view illustrating subpixels according to still another embodiment of the disclosure.

FIG. 29 is a layout view illustrating subpixels according to still another embodiment of the disclosure.

A display device 1_6 according to the embodiment may include a first pixel driving part PDU1 of a first subpixel SP1, a second pixel driving part PDU2 of a second subpixel SP2, a third pixel driving part PDU3 of a third subpixel SP3, and a fourth pixel driving part PDU4 of a fourth subpixel SP4. The first pixel driving part PDU1, the second pixel driving part PDU2, the third pixel driving part PDU3, and the fourth pixel driving part PDU4 may be disposed sequentially along the first direction X.

In the embodiment, the second initialization voltage line VIL2 may include a first sub-initialization voltage line VIL2_1 disposed in the first pixel driving part PDU1 and the second pixel driving part PDU2, and includes a second sub-initialization voltage line VIL2_2 disposed in the third pixel driving part PDU3 and the fourth pixel driving part PDU4.

The first sub-initialization voltage line VIL2_1 and the second sub-initialization voltage line VIL2_2 may be disposed in the first data conductive layer 600, and may be spaced apart from each other. The first sub-initialization voltage line VIL2_1 and the second sub-initialization voltage line VIL2_2 may be connected to the initialization connection electrode VIE. The initialization connection electrode VIE may be connected to the first sub-initialization voltage line VIL2_1 through a sixteenth contact hole CNT16, and may be connected to the second sub-initialization voltage line VIL2_2 through a seventeenth contact hole CNT17.

The initialization connection electrode VIE may be included in the second data conductive layer 700. The sixteenth contact hole CNT16 may be a hole that exposes the first sub-initialization voltage line VIL2_1 by passing through the first passivation layer ('861' of FIG. 11), and the seventeenth contact hole CNT17 may be a hole that exposes the second sub-initialization voltage line VIL2_2 by passing through the first passivation layer 861.

However, in case that a second passivation layer 862 disposed on the second data conductive layer 700, a third data conductive layer 700 disposed on the second passivation layer 862, and a third passivation layer disposed on the third data conductive layer 700 are further provided, the initialization connection electrode VIE may be included in the third data conductive layer 700. The initialization connection electrode VIE may be connected to the first sub-initialization voltage line VIL2_1 and the second sub-initialization voltage line VIL2_2 through a hole that passes through the second passivation layer 862.

Therefore, the same second initialization voltage line may be applied to the first sub-initialization voltage line VIL2_1 and the second sub-initialization voltage line VIL2_2.

Figure 30:
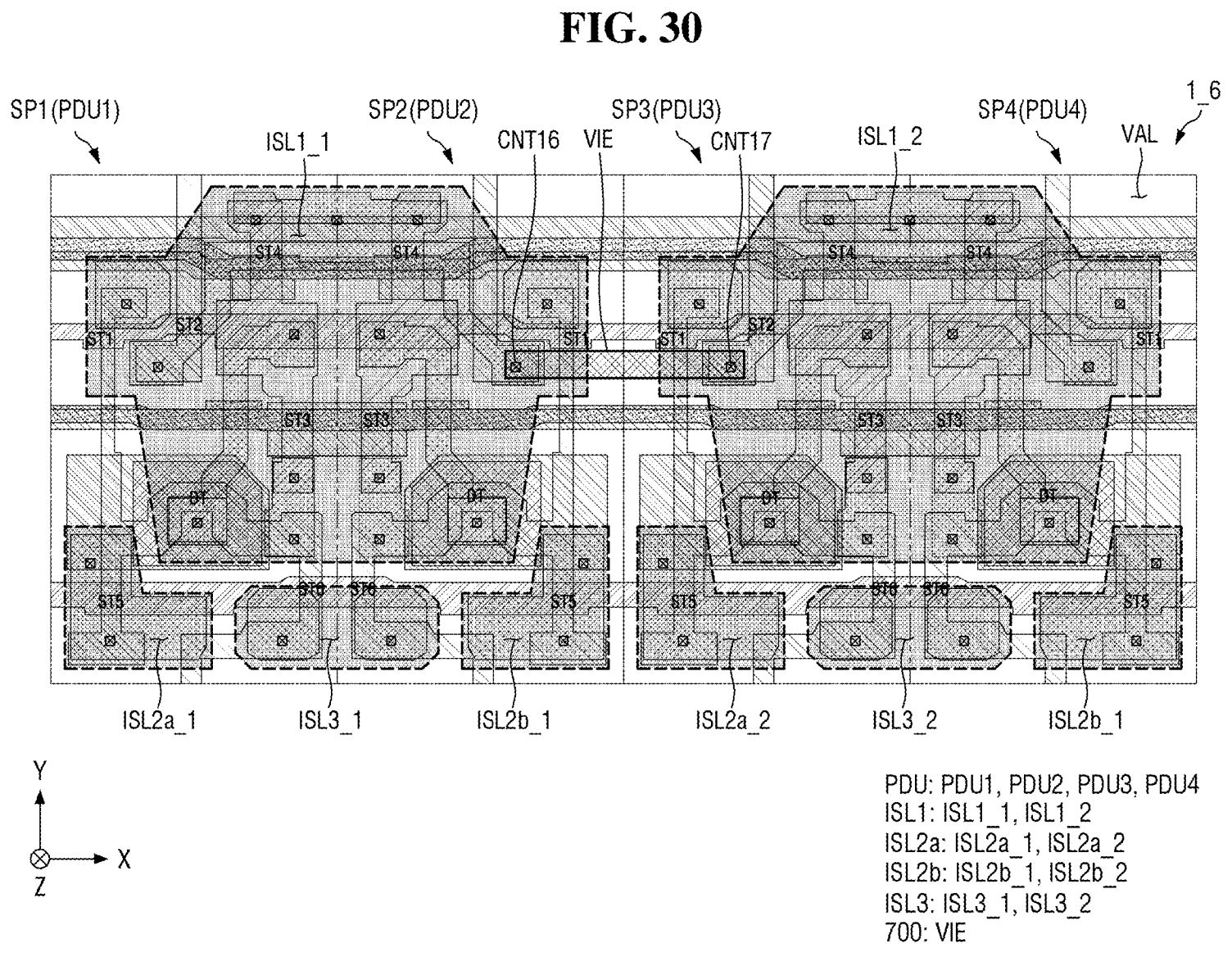

FIG. 30 is a layout view illustrating multiple island patterns and a valley in FIG. 29.

Referring to FIG. 30, the island patterns ISL1_1, ISL1_2, ISL2a_1, ISL2a_2, ISL2b_1, ISL2b_2 and ISL3_1, ISL3_2 may be disposed in the first pixel driving part PDU1, the second pixel driving part PDU2, the third pixel driving part PDU3, and the fourth pixel driving part PDU4.

In this embodiment, the valley VAL may be formed in an area that is not overlapping the first data conductive layer 600. Since the first sub-initialization voltage line VIL2_1 and the second sub-initialization voltage line VIL2_2 of the first data conductive layer 600 are spaced apart from each other, the valley VAL may be formed in an area between the first sub-initialization voltage line VIL2_1 and the second sub-initialization voltage line VIL2_2.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a substrate;
a plurality of island pattern areas;
a valley area partitioning the plurality of island pattern areas;
a light emitting element emitting light; and
a pixel driving part comprising a first subpixel driving part and a second subpixel driving part and supplying a driving current to the light emitting element,
wherein the plurality of island pattern areas comprise:
a first island pattern area in which the first subpixel driving part is disposed, and
a second island pattern area in which the second subpixel driving part is disposed.

2. The display device of claim 1, wherein an area of the first island pattern area is different from an area of the second island pattern area.

3. The display device of claim 1, wherein:
the pixel driving part comprises a plurality of transistors,
the first subpixel driving part comprises at least part of the plurality of transistors, and
the second subpixel driving part comprises at least another part of the plurality of transistors.

4. The display device of claim 3, wherein a number of the at least part of the plurality of transistors is different from a number of the at least another part of the plurality of transistors.

5. The display device of claim 1, wherein the light emitting element overlaps the first island pattern area and the second island pattern area in a thickness direction of the substrate.

6. The display device of claim 3, further comprising:
a scan line capable of applying a scan signal to the pixel driving part,
wherein a channel area of one of the at least part of the plurality of transistors, which overlaps the scan line in a thickness direction of the substrate, is disposed in the first island pattern area.

7. The display device of claim 1, wherein
the first island pattern area has a planar polygonal shape in a plan view, and an outer angle defined by any two adjacent sides of the planar polygonal shape is greater than or equal to about 90°.

8. The display device of claim 1, wherein the first island pattern area has a planar polygonal shape in a plan view, and an inner angle defined by any two adjacent sides of the planar polygonal shape is greater than or equal to about 90°.

9. The display device of claim 1, wherein the first island pattern area comprises a planar curved portion in a plan view.

10. A display device comprising:

a plurality of island pattern areas;

a valley area partitioning the plurality of island pattern areas; and a thin film transistor layer disposed on a substrate, wherein the thin film transistor layer comprises:

a first semiconductor layer;

a first insulating layer disposed on the first semiconductor layer;

a first conductive layer disposed on the first insulating layer;

a second insulating layer disposed on the first conductive layer; and a first data conductive layer disposed on the second insulating layer, wherein an upper surface of the first conductive layer offset from the first data conductive layer in a thickness direction of the substrate is exposed in the valley area, and the first data conductive layer is disposed in each of the plurality of island pattern areas.

11. The display device of claim 10, wherein the thin film transistor layer further comprises a first passivation layer disposed on the first data conductive layer, and the first conductive layer and the first insulating layer disposed in the valley area are covered by the first passivation layer.

12. The display device of claim 11, wherein the first conductive layer and the first insulating layer are directly in contact with the first passivation layer in the valley area, and the first passivation layer comprises an organic material.

13. The display device of claim 10, wherein the second insulating layer does not overlap the valley area in the thickness direction of the substrate.

14. The display device of claim 10, wherein in each of the plurality of island pattern areas, the thin film transistor layer further comprises:

a second semiconductor layer;

a third insulating layer disposed on the second semiconductor layer;

a second conductive layer disposed on the third insulating layer; and a fourth insulating layer disposed on the second conductive layer, and the first semiconductor layer is disposed on the fourth insulating layer.

15. The display device of claim 14, wherein the first semiconductor layer comprises an oxide semiconductor, and the second semiconductor layer comprises silicon.

16. The display device of claim 14, wherein the second semiconductor layer, the third insulating layer, the second conductive layer, the fourth insulating layer, the first insulating layer, and the first conductive layer are sequentially disposed in the valley area.

17. The display device of claim 10, wherein in each of the plurality of island pattern areas, the thin film transistor layer further comprises:

a second conductive layer disposed on the first insulating layer;

a third insulating layer disposed on the second conductive layer; and a third conductive layer disposed on the third insulating layer, and the second conductive layer and the third insulating layer are disposed between the first insulating layer and the third conductive layer.

18. The display device of claim 17, wherein the first semiconductor layer, the first insulating layer, the second conductive layer, the third insulating layer, and the third conductive layer are sequentially disposed in the valley area.

* * * * *